United States Patent
Minowa

(10) Patent No.: US 9,794,497 B2
(45) Date of Patent: Oct. 17, 2017

(54) SOLID-STATE IMAGING DEVICE CONTROLLING READ-OUT OF SIGNALS FROM PIXELS IN FIRST AND SECOND AREAS

(71) Applicant: CANON KABUSHIKI KAISHA, Tokyo (JP)

(72) Inventor: Masaaki Minowa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 63 days.

(21) Appl. No.: 14/929,818

(22) Filed: Nov. 2, 2015

(65) Prior Publication Data

US 2016/0173797 A1 Jun. 16, 2016

(30) Foreign Application Priority Data

Dec. 10, 2014 (JP) ................................. 2014-249713

(51) Int. Cl.
*H04N 5/341* (2011.01)
*H04N 5/355* (2011.01)
(Continued)

(52) U.S. Cl.
CPC ....... *H04N 5/341* (2013.01); *H01L 27/14609* (2013.01); *H01L 27/14654* (2013.01);
(Continued)

(58) Field of Classification Search
None
See application file for complete search history.

(56) References Cited

U.S. PATENT DOCUMENTS 8,749,683 B2 6/2014 Minowa et al.
9,232,164 B2 1/2016 Minowa et al.
(Continued)

FOREIGN PATENT DOCUMENTS

JP 2006-246450 9/2006

OTHER PUBLICATIONS

U.S. Appl. No. 14/489,812, Takashi Moriyama, filed Sep. 18, 2014.
U.S. Appl. No. 14/855,616, Masaaki Minowa, filed Sep. 16, 2015.

*Primary Examiner* — Justin P Misleh
(74) *Attorney, Agent, or Firm* — Fitzpatrick, Cella, Harper & Scinto

(57) ABSTRACT

A solid-state imaging device includes a plurality of pixels each including a photoelectric conversion unit, a charge accumulating portion accumulating signal charges transferred from the photoelectric conversion unit, a floating diffusion portion accumulating signal charges transferred from the charge accumulating portion, and a read-out unit transferring signal charges from the charge accumulating portion to the floating diffusion portion and output a signal corresponding to the signal charges, and a control unit controlling the read-out unit to start, after starting read-out of signals of one frame from the charge accumulating portions, an accumulation of signal charges for a next frame at the photoelectric conversion units simultaneously, and to start, before completing the read-out of the signal of the one frame, an accumulation of signal charges at the charge accumulating portion of a pixel among the plurality of pixels from which the signal of the one frame is already read out.

19 Claims, 10 Drawing Sheets

(51) Int. Cl.
  *H04N 5/374*  (2011.01)
  *H01L 27/146*  (2006.01)
  *H04N 5/3745*  (2011.01)
  *H04N 5/359*  (2011.01)

(52) U.S. Cl.
  CPC ....... *H04N 5/3559* (2013.01); *H04N 5/37452* (2013.01); *H04N 5/355* (2013.01); *H04N 5/3591* (2013.01)

(56) References Cited

U.S. PATENT DOCUMENTS

| | | | |
|---|---|---|---|
| 2011/0007196 A1* | 1/2011 | Yamashita | H01L 27/14609 348/294 |
| 2011/0242378 A1* | 10/2011 | Mabuchi | H01L 27/14609 348/296 |
| 2012/0326010 A1* | 12/2012 | Mabuchi | H04N 5/353 250/208.1 |
| 2013/0083225 A1 | 4/2013 | Minowa et al. | |

* cited by examiner

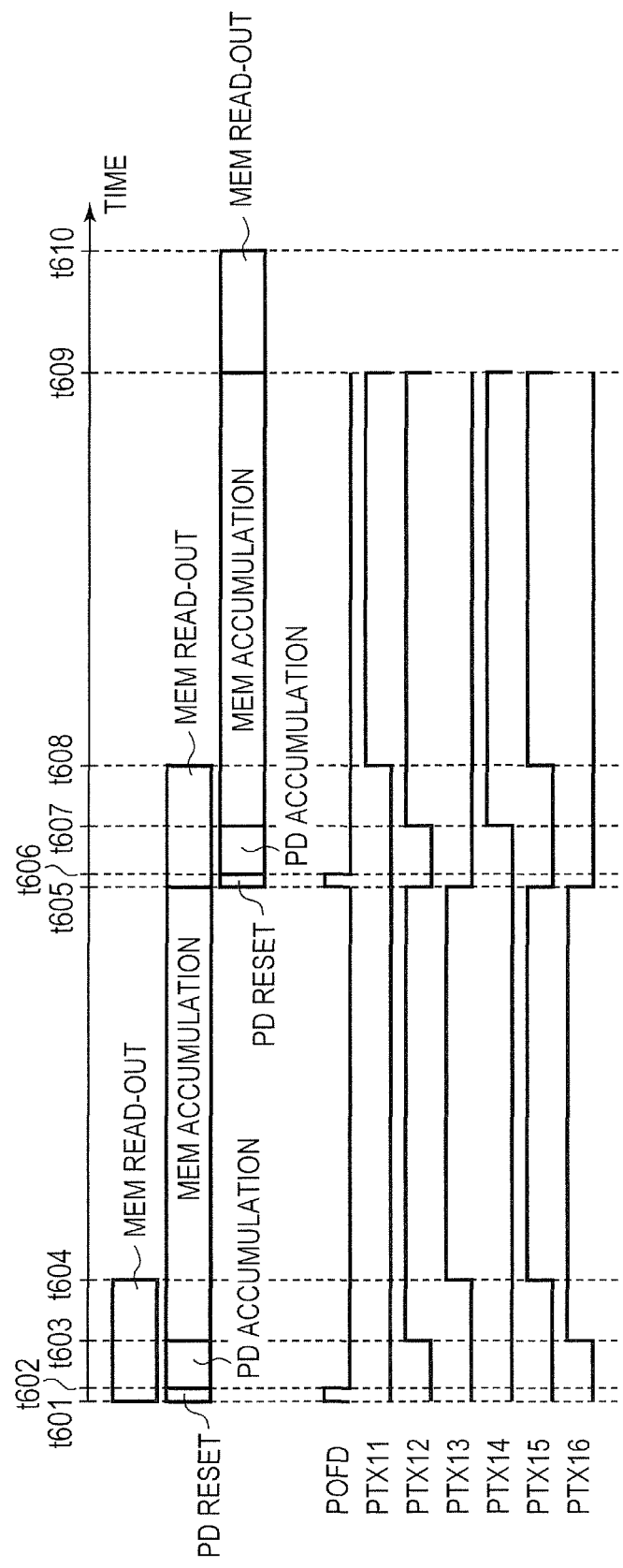

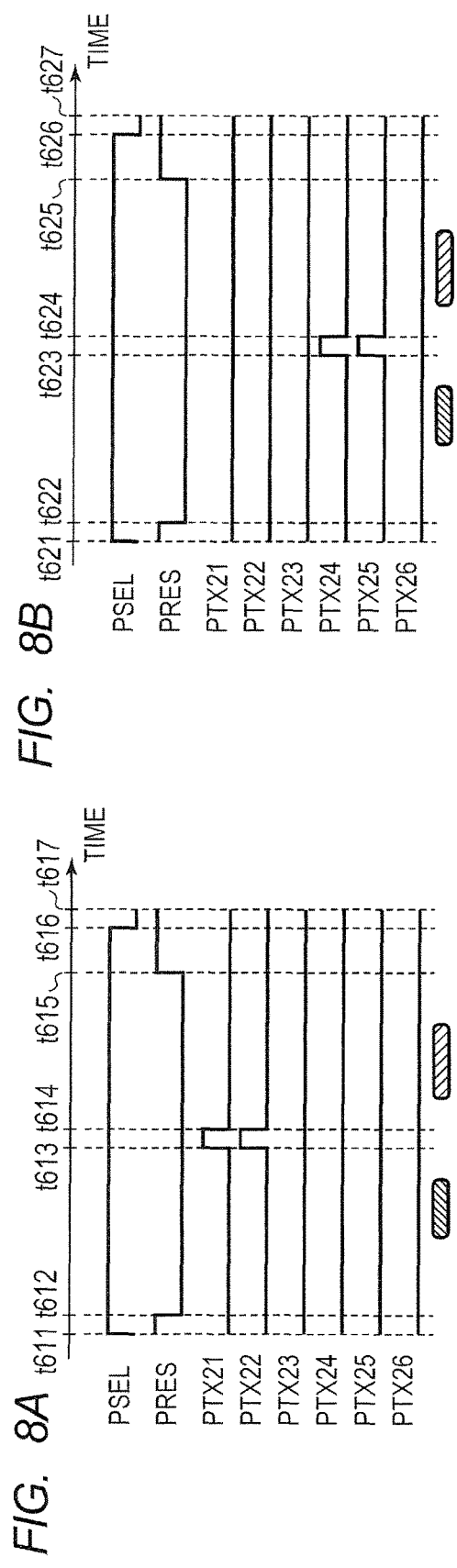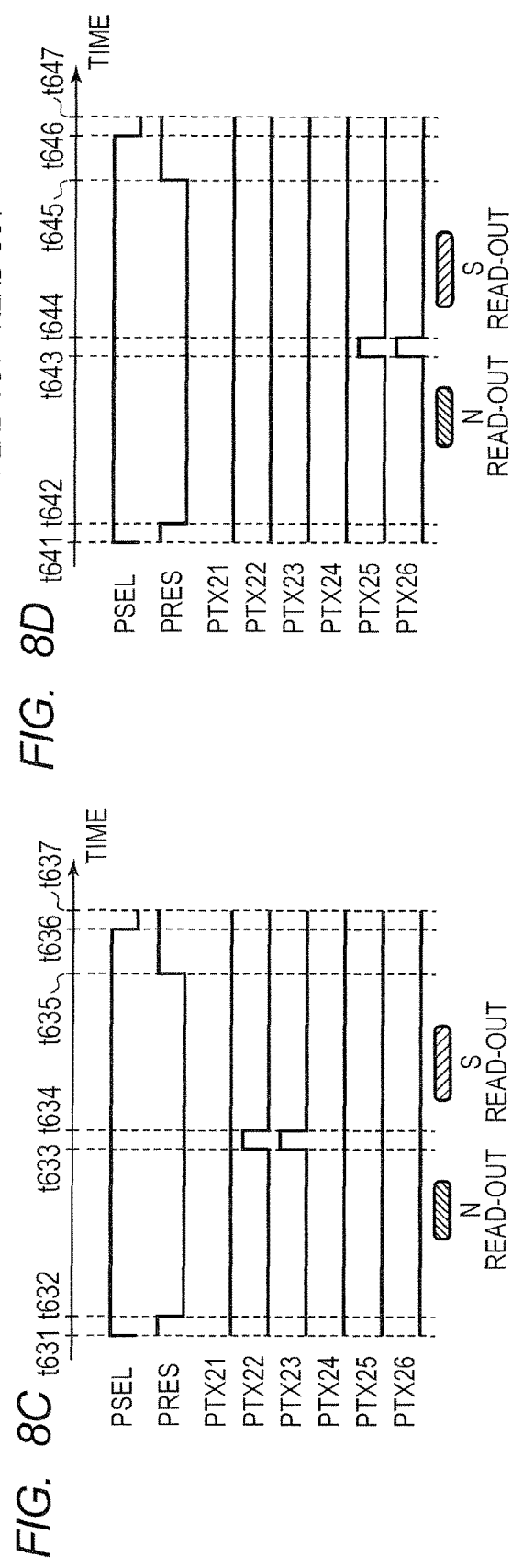

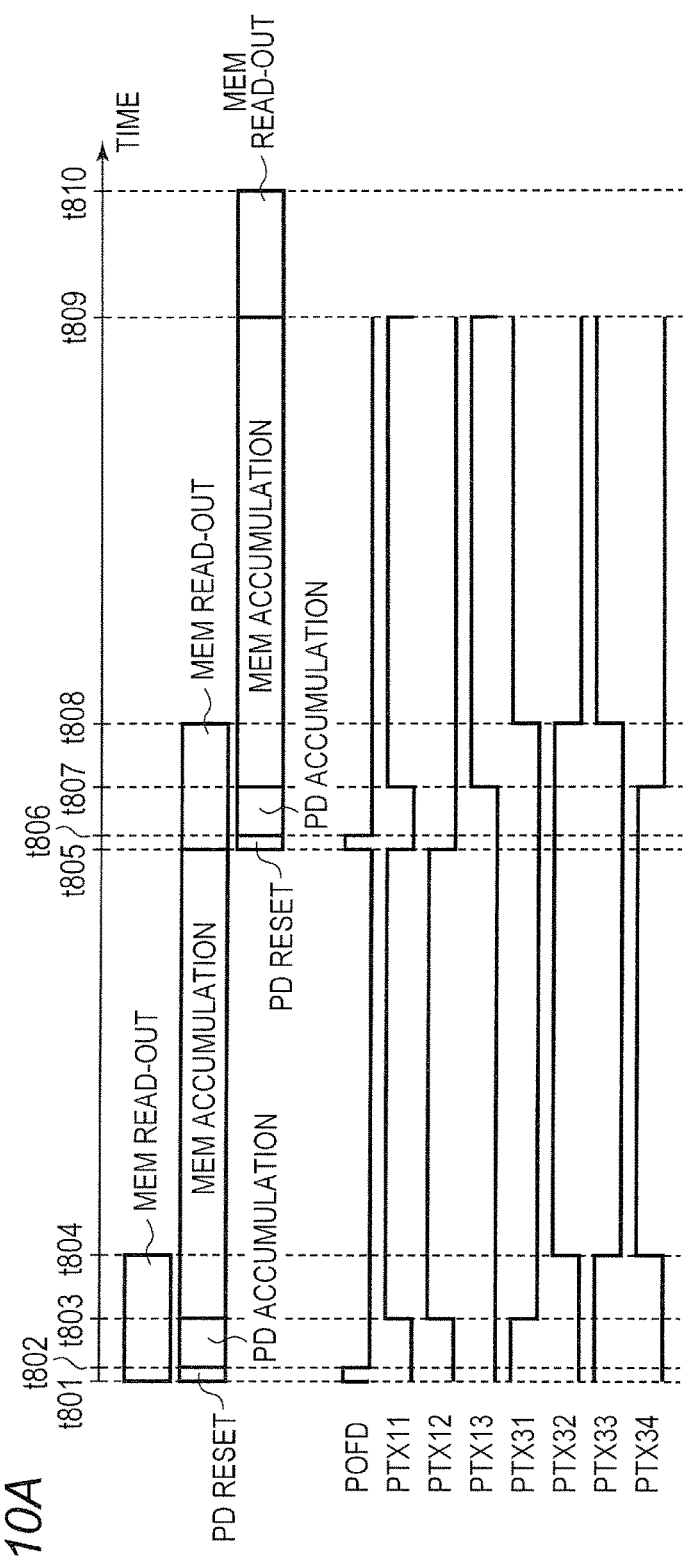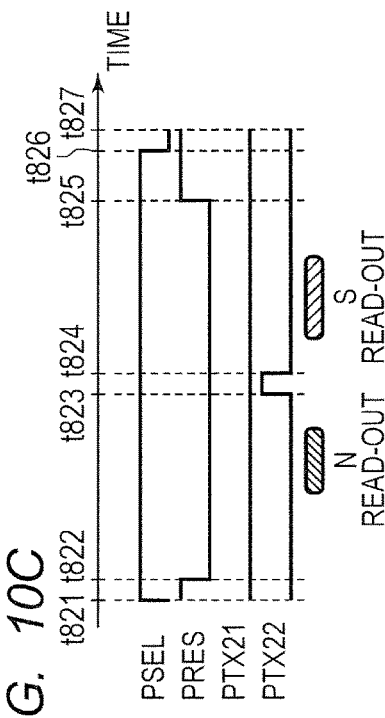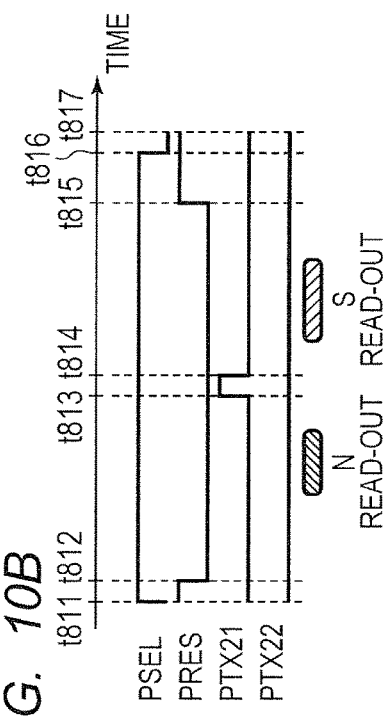

SOLID-STATE IMAGING DEVICE CONTROLLING READ-OUT OF SIGNALS FROM PIXELS IN FIRST AND SECOND AREAS

BACKGROUND OF THE INVENTION

Field of the Invention

The present invention relates to a solid-state imaging device and a method of driving the solid-state imaging device.

Description of the Related Art

In recent years, imaging devices such as digital video camera, digital camera, and the like each using a CMOS image sensor suitable to realize a low electric power consumption and a high-speed read-out have widely and generally been spread. In the CMOS image sensor, the sequential read-out operation (rolling shutter operation) for sequentially reading out pixels every row or every block of a few rows is fundamentally executed. A CMOS image sensor having a function of a full-pixel simultaneous electronic shutter has also been proposed. Japanese Patent Application Laid-Open No. 2006-246450 discloses a technique for widening a dynamic range of the CMOS image sensor having the function of the full-pixel simultaneous electronic shutter.

The CMOS image sensor having the function of the full-pixel simultaneous electronic shutter has a charge accumulating portion for temporarily accumulating signal charges generated in a photodiode. A read-out period of the signal accumulated in the charge accumulating portion overlaps with an accumulating period of the signal charges into the photodiode for a next frame. However, if signal charges exceeding a saturation charge amount of the photodiode occur during the read-out period of the signal from the charge accumulating portion, since the signal charges over the saturation charge amount are thrown away, there is a case where a picture quality deteriorates.

SUMMARY OF THE INVENTION

It is an aspect of the present invention to provide a solid-state imaging device which can suppress a deterioration of a picture quality due to a saturation of a photodiode and a method of driving such a solid-state imaging device.

According to an aspect of the present invention, there is provided a solid-state imaging device including a plurality of pixels each including a photoelectric conversion unit configured to photoelectrically convert incident light into signal charges, a charge accumulating portion configured to accumulate signal charges transferred from the photoelectric conversion unit, a floating diffusion portion configured to accumulate signal charges transferred from the charge accumulating portion, and a read-out unit configured to transfer signal charges from the charge accumulating portion to the floating diffusion portion and read out a signal corresponding to the signal charges transferred to the floating diffusion portion, and a control unit configured to control the read-out unit so as to start, after starting a read-out of signals of one frame from the charge accumulating portions of the plurality of pixels, an accumulation of signal charges for a next frame at the photoelectric conversion units of the plurality of pixels simultaneously, and to start, before completing the read-out of the signal of the one frame, an accumulation of signal charges at the charge accumulating portion of a pixel among the plurality of pixels from which the signal of the one frame is already read out.

Further features of the present invention will become apparent from the following description of exemplary embodiments with reference to the attached drawings.

BRIEF DESCRIPTION OF THE DRAWINGS

FIGS. 7, 8A, 8B, 8C, and 8D are timing charts illustrating a method of driving the solid-state imaging device according to the third embodiment of the present invention.

FIGS. 10A, 10B, and 10C are timing charts illustrating a method of driving the solid-state imaging device according to the fourth embodiment of the present invention.

DESCRIPTION OF THE EMBODIMENTS

Preferred embodiments of the present invention will now be described in detail in accordance with the accompanying drawings.

First Embodiment

A solid-state imaging device and a method of driving the same according to a first embodiment of the present invention will now be described in detail with reference to FIGS. 1 to 4B.

Figure 1:
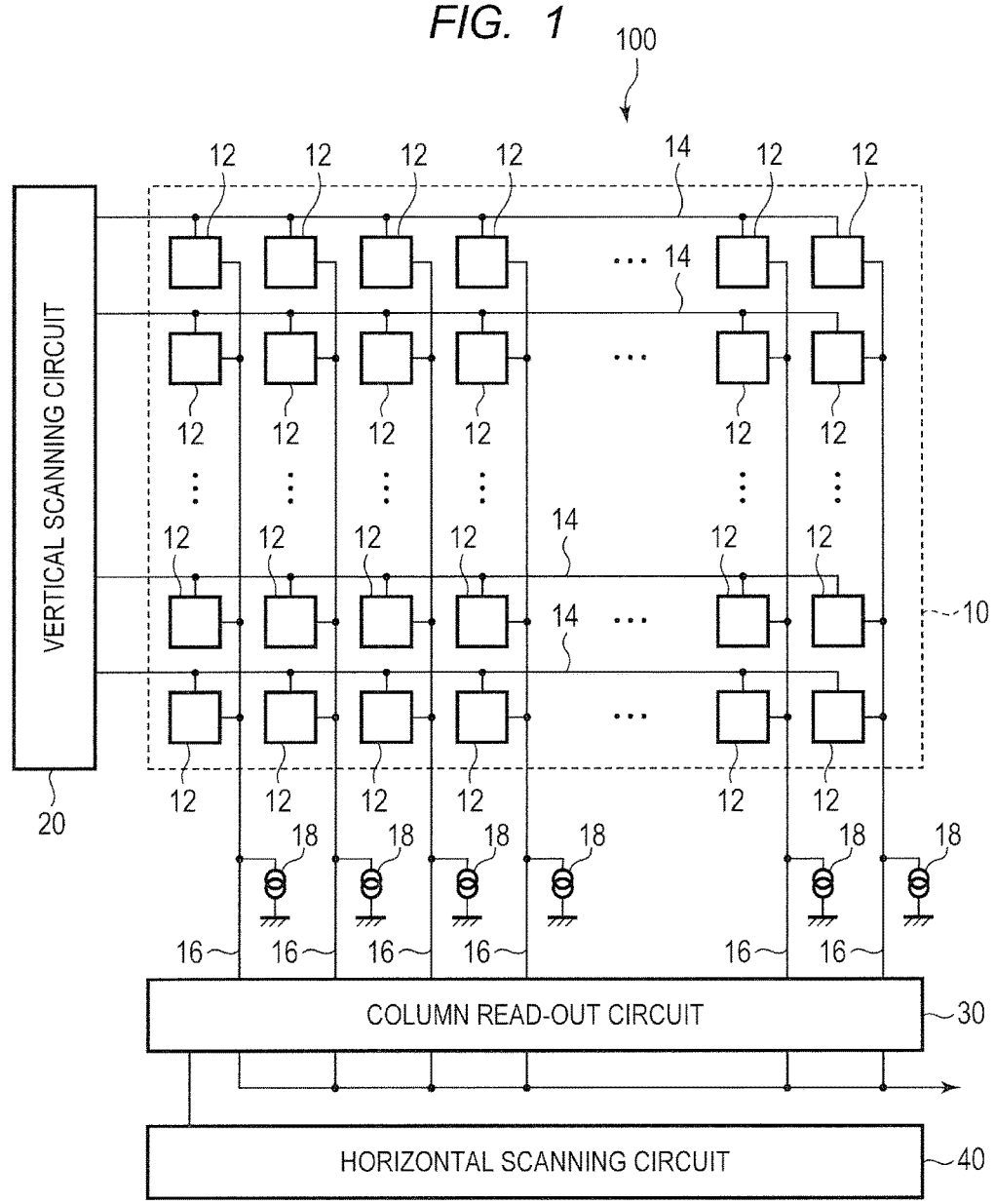
FIG. 1 is a block diagram illustrating a construction of a solid-state imaging device according to a first embodiment of the present invention.
Figure 2:
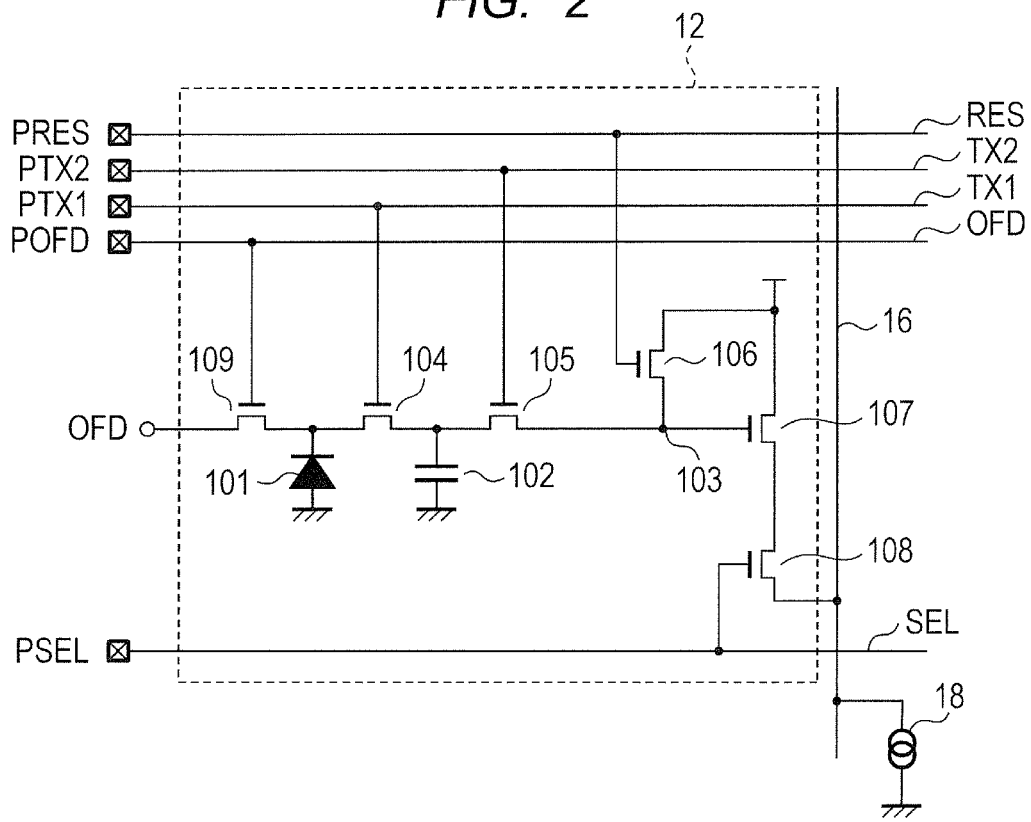
FIG. 2 is a diagram illustrating a circuit construction of a pixel of the solid-state imaging device according to the first embodiment of the present invention.
Figure 3:
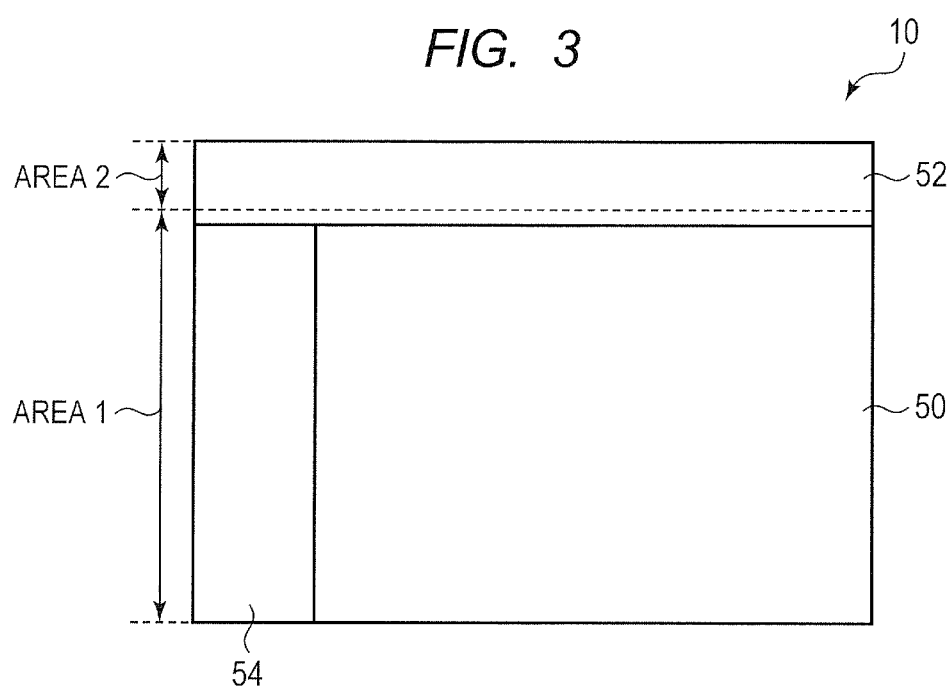
FIG. 3 is a diagram illustrating a construction of a pixel area of the solid-state imaging device according to the first embodiment of the present invention.
Figure 4A:
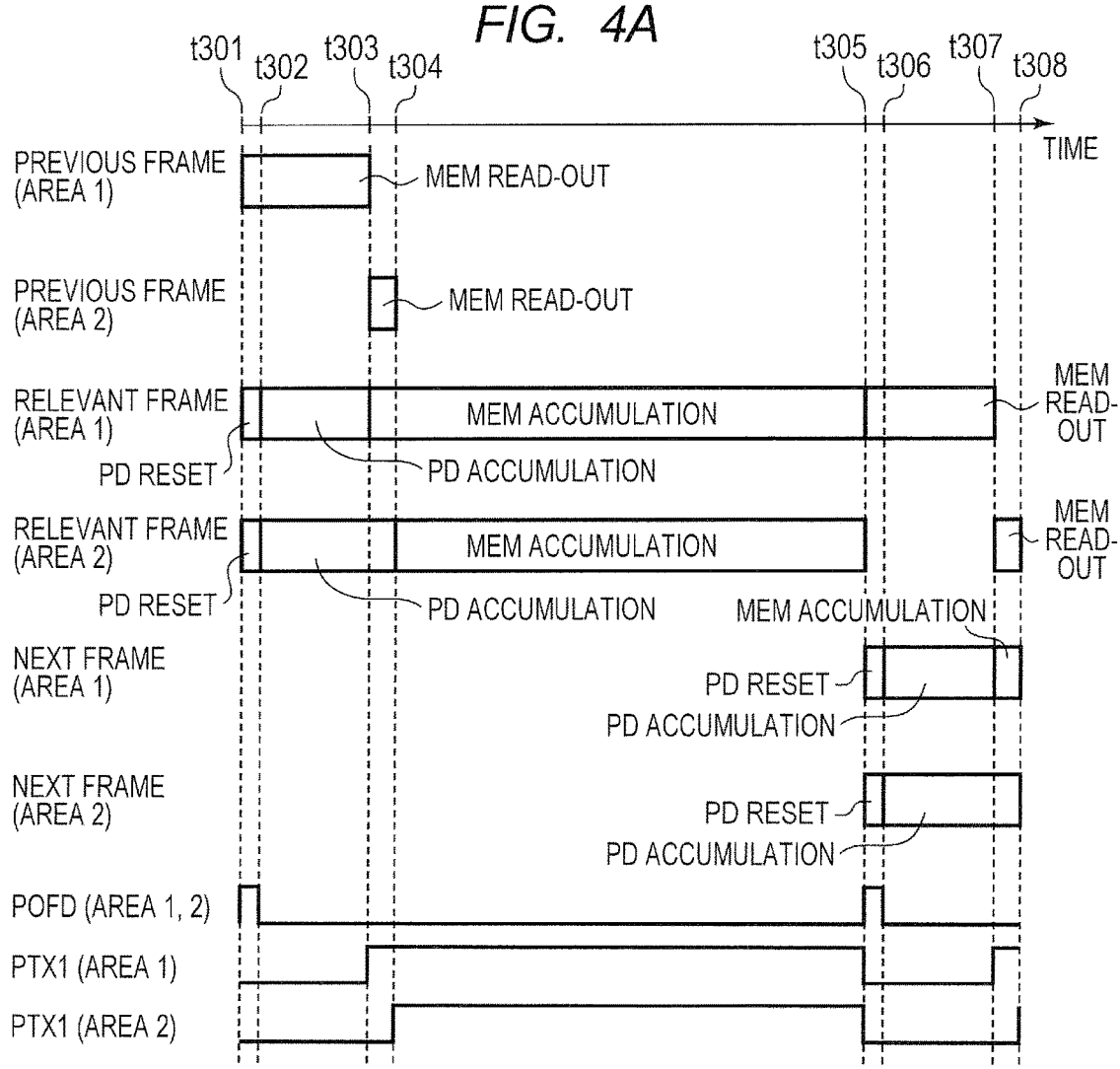
FIGS. 4A and 4B are timing charts illustrating a method of driving the solid-state imaging device according to the first embodiment of the present invention.
Figure 4B:
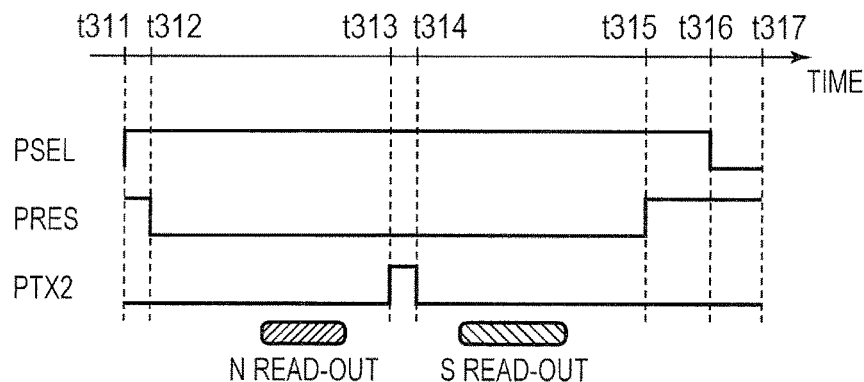

FIG. 1 is a block diagram illustrating a construction of the solid-state imaging device according to the present embodiment. FIG. 2 is a diagram illustrating a circuit construction of a pixel of the solid-state imaging device according to the present embodiment. FIG. 3 is a diagram illustrating a construction of a pixel area of the solid-state imaging device according to the present embodiment. FIGS. 4A and 4B are timing charts illustrating the method of driving the solid-state imaging device according to the present embodiment.

First, a structure of the solid-state imaging device according to the present embodiment will be described with reference to FIGS. 1 to 3.

As illustrated in FIG. 1, a solid-state imaging device 100 according to the present embodiment has a pixel area 10, a vertical scanning circuit 20, a column read-out circuit 30, and a horizontal scanning circuit 40.

A plurality of pixels 12 are arranged in the pixel area 10 in a matrix form along row direction and column direction.

In FIG. 1, only a part of pixels 12 in a pixel array are illustrated for simplicity of drawing. The number of pixels 12 arranged in the row direction and the column direction is not particularly limited. In the specification, it is assumed that the row direction indicates the lateral direction (horizontal direction) in the drawings and the column direction indicates the longitudinal direction (vertical direction) in the drawings.

As illustrated in FIG. 2, the pixel 12 includes a photodiode 101, a first transfer transistor 104, and a second transfer transistor 105. The pixel 12 also includes a reset transistor 106, an amplifier transistor 107, a select transistor 108, and an overflow drain control transistor 109.

An anode of the photodiode (hereinbelow, referred to as "PD") 101 is connected to a ground voltage line and a cathode is connected to a source of the first transfer transistor 104 and a source of the overflow drain (hereinbelow, referred to as "OFD") control transistor 109. A drain of the first transfer transistor 104 is connected to a source of the second transfer transistor 105. A connection node between the drain of the first transfer transistor 104 and the source of the second transfer transistor 105 constructs a charge accumulating portion (hereinbelow, referred to as "MEM") 102. In FIG. 1, the MEM 102 is illustrated as a capacitor. A drain of the second transfer transistor 105 is connected to a source of the reset transistor 106 and a gate of the amplifier transistor 107. A connection node among the drain of the second transfer transistor 105, the source of the reset transistor 106, and the gate of the amplifier transistor 107 constructs a floating diffusion portion (hereinbelow, referred to as "FD portion") 103. A drain of the reset transistor 106 and a drain of the amplifier transistor 107 are connected to a power voltage line (voltage Vdd). A source of the amplifier transistor 107 is connected to a drain of the select transistor 108.

There is a case where denominations of the sources and drains of the transistors differ in dependence on a conductivity type of the transistor, an attractive function, or the like. There is also a case where a part or all of the foregoing sources and drains are called by opposite denominations. In the specification, with respect to the transistor locating on a propagating path of the signal charges generated by the PD, the node into which the signal charges flow is expressed as a source and the node from which the signal charges flow out is expressed as a drain.

The PD 101 is a photoelectric conversion unit to generate signal charges corresponding to an intensity of incident light. The first transfer transistor 104 is provided to transfer the charges generated and accumulated in the PD 101 to the MEM 102. The second transfer transistor 105 is provided to transfer the charges accumulated in the MEM 102 to the FD portion 103. The reset transistor 106 is used to reset the charges in the FD portion 103. The amplifier transistor 107 is provided to amplify the signal corresponding to an amount of charges in the FD portion 103 and output. The select transistor 108 is provided to select the pixel to be read out. The OFD control transistor 109 is used when the charges in the PD 101 are reset.

As will be described hereinafter, there is also a case where a part of the plurality of pixels 12 arranged in the pixel area 10 are constructed by light-shielded pixels or dummy pixels which do not include PDs.

A driving signal line 14 is arranged in each row of the pixel array of the pixel area 10 so as to extend in the row direction. The driving signal line 14 is a signal line common to the pixels 12 arranged in the row direction. The driving signal lines 14 are connected to the vertical scanning circuit 20. When reading out the signal from the pixel 12, predetermined driving signals to drive a pixel read-out unit of the pixel 12 are output from the vertical scanning circuit 20 to the driving signal line 14 at predetermined timing. The vertical scanning circuit 20 is a control unit to read out the pixel signals from the pixels 12 by controlling the pixel read-out unit of the pixel 12. Although a state where one driving signal line is arranged in each row is illustrated in FIG. 1, typically, a plurality of driving signal lines are included in each row.

In the case of the pixel 12 illustrated in FIG. 2, a reset signal line RES, a first transfer gate signal line TX1, a second transfer gate signal line TX2, a select signal line SEL, and an OFD control signal line OFD are included in the driving signal lines 14. The reset signal line RES is connected to gates of the reset transistors 106 and is provided to control the operation of the reset transistors 106 by a reset signal PRES which is output from the vertical scanning circuit 20. The first transfer gate signal line TX1 is connected to gates of the first transfer transistors 104 and is provided to control the operation of the first transfer transistors 104 by a first transfer gate control signal PTX1 which is output from the vertical scanning circuit 20. The second transfer gate signal line TX2 is connected to gates of the second transfer transistors 105 and is provided to control the operation of the second transfer transistors 105 by a second transfer gate control signal PTX2 which is output from the vertical scanning circuit 20. The select signal line SEL is connected to gates of the select transistors 108 and is provided to control the operation of the select transistors 108 by a select signal PSEL which is output from the vertical scanning circuit 20. The OFD control signal line OFD is connected to gates of the OFD control transistor 109 and is provided to control the operation of the OFD control transistors 109 by an OFD control signal POFD which is output from the vertical scanning circuit 20.

A vertical signal line 16 is arranged in each column of the pixel array of the pixel area 10 so as to extend in the column direction. The vertical signal line 16 is connected to sources of the select transistors 108 of the pixels 12 arranged in the column direction and is a signal line common to the pixels 12. One end portion of the driving signal line 14 is connected to the column read-out circuit 30 and a current source 18.

The column read-out circuit 30 is a circuit to read out, every column, the pixel signals output from the pixel area 10. The horizontal scanning circuit 40 is connected to the column read-out circuit 30. In response to a control signal from the horizontal scanning circuit 40, the column read-out circuit 30 sequentially outputs, every column, the pixel signals read out of the pixels 12 to an output circuit (not illustrated).

As illustrated in FIG. 3, the pixel area 10 has a valid area 50, a vertical optical black area (hereinbelow, referred to as "vertical OB area") 52, and a horizontal optical black area (hereinbelow, referred to as "horizontal OB area") 54. The pixels 12 arranged in the pixel area 10 in a matrix form are allocated to each area on a row or column unit basis.

The valid area 50 is a continuous area where the pixels 12 in FIG. 2 are arranged in the matrix form and is an area to obtain an image signal of the image focused onto this area.

The horizontal OB area 54 is arranged in the row direction so as to be adjacent to the valid area 50. The horizontal OB area 54 is constructed by the light-shielded pixels 12 or dummy pixels which do not include PDs and is used to obtain a reference signal of a black level or to correct a variation every row. The pixels 12 (or dummy pixels) in the horizontal OB area 54 and the pixels 12 in the valid area 50 are arranged in the different columns of the pixel array.

The vertical OB area 52 is arranged in the column direction so as to be adjacent to the valid area 50. The vertical OB area 52 is constructed by the light-shielded pixels 12 or dummy pixels which do not include PDs and is used to obtain a reference signal of a black level or to correct a variation every column. The pixels 12 (or dummy pixels) in the vertical OB area 52 and the pixels 12 in the valid area 50 are arranged in the different rows of the pixel array.

As illustrated in FIG. 3, the pixel area 10 is divided into an area 1 (first area) and an area 2 (second area) by the rows. When the pixel signals are read out of the pixel area 10, the pixels 12 in the area 1 are read out earlier than those in the area 2. In the example of FIG. 3, the area 1 includes all of the rows to which the pixels 12 in the valid area 50 belong. The area 2 includes at least a part of the rows to which the pixels 12 in the vertical OB area 52 belong. When the area 2 includes only a part of the rows to which the pixels 12 in the vertical OB area 52 belong, other rows to which the pixels 12 in the vertical OB area 52 belong are included in the area 1.

Subsequently, a method of driving the solid-state imaging device according to the present embodiment will be described with reference to FIGS. 4A and 4B. FIG. 4A is a timing chart illustrating the operation in one frame period. FIG. 4B is a timing chart illustrating the operation in one horizontal period. One horizontal period is a period of time during which the pixel signals of one row are read out.

In FIG. 4A, a period from time t301 to time t308 is the one frame period (in the diagram, relevant frame), which will be described here. A period from time t301 to time t304 overlaps with a previous frame period. A period from time t305 to time t308 overlaps with a next frame period.

At time t301, the signal charges of the previous frame have been accumulated in the MEM 102. The signal charges accumulated in the MEM 102 of the pixels 12 in the area 1 among the pixels 12 in the pixel area 10 are sequentially read out for a period between time t301 and time t303 (hereinbelow, the read-out operation from the MEM 102 is referred to as "MEM read-out"). The signal charges accumulated in the MEM 102 of the pixels 12 in the area 2 are sequentially read out for a subsequent period between time t303 and time t304 (MEM read-out). Since a procedure for the MEM read-out in a period between time t301 and time t304 is substantially the same as that in a period between time t305 and time t308, which will be described hereinafter, its description is omitted here.

In parallel with the MEM read-out of the previous frame, the next frame period (in the diagram, relevant frame) starts from time t301.

At time t301, the first transfer gate control signal PTX1 is at the low level and the first transfer transistor 104 is OFF.

In a period between time t301 and time t302, the OFD control signal POFD of the high level is output from the vertical scanning circuit 20 to the OFD control signal lines OFD of all rows. Thus, the OFD control transistor 109 is turned on and the PDs 101 of all of the pixels 12 are reset (hereinbelow, the resetting period of the PD 101 is referred to as "PD reset").

Subsequently, when the OFD control signal POFD is set to the low level at time t302, the OFD control transistor 109 is turned off, the reset of the PDs 101 is cancelled, and the accumulation of the signal charges is simultaneously started in the PD 101 with respect to all of the pixels.

In a period between time t302 and time t303, the signal charges generated in the PD 101 in the area 1 are accumulated as they are into the PD 101 (hereinbelow, an accumulating period of the signal charges in the PD 101 is referred to as "PD accumulation"). In a period between time t302 and time t304, the signal charges generated in the PD 101 in the area 2 are accumulated as they are into the PD 101 (PD accumulation).

Subsequently, in a period between time t303 and time t305, the first transfer gate control signal PTX1 of the high level is output from the vertical scanning circuit 20 to the first transfer gate signal line TX1 connected to the pixel 12 in the area 1. Thus, the first transfer transistor 104 of the pixel 12 in the area 1 is turned on and the signal charges accumulated in the PD 101 of the pixel 12 in the area 1 are transferred to the MEM 102. At time t303, the MEM read-out of the previous frame of the area 1 has been finished and the MEM 102 of the pixel 12 in the area 1 is empty. In a period between time t303 and time t305, the first transfer gate control signal PTX1 connected to the pixel 12 in the area 1 is always at the high level. The signal charges generated in the PD 101 are immediately transferred to the MEM 102 and are accumulated in the MEM 102. An accumulating period of the signal charges to the MEM 102 is hereinbelow referred to as "MEM accumulation."

In a period between time t304 and time t305 after time t303, the first transfer gate control signal PTX1 of the high level is output from the vertical scanning circuit 20 to the first transfer gate signal line TX1 connected to the pixel 12 in the area 2. Thus, the first transfer transistor 104 of the pixel 12 in the area 2 is turned on and the signal charges accumulated in the PD 101 of the pixel 12 in the area 2 are transferred to the MEM 102. At time t304, the MEM read-out of the previous frame of the area 2 has been finished and the MEM 102 of the pixel 12 in the area 2 is empty. In a period between time t304 and time t305, the first transfer gate control signal PTX1 connected to the pixel 12 in the area 2 is always at the high level. The signal charges generated in the PD 101 are immediately transferred to the MEM 102 and are accumulated in the MEM 102 (MEM accumulation).

Subsequently, when the first transfer gate control signals PTX1 of all rows are set to the low level at time t305, the first transfer transistor 104 is turned off and the transfer of the signal charges to the MEM 102 is simultaneously finished with respect to all of the pixels 12. By such a driving, in all of the pixels 12, the signals of the aligned accumulating periods of the signal charges can be obtained and a global electronic shutter can be realized.

Subsequently, in a period between time t305 and time t306, the OFD control signal POFD of the high level is output from the vertical scanning circuit 20 to the OFD control signal lines OFD of all of the rows. Thus, the OFD control transistor 109 is turned on and the PD 101 is reset (PD reset).

Subsequently, when the OFD control signal POFD is set to the low level at time t306, the OFD control transistor 109 is turned off, the reset of the PD 101 is cancelled, and the signal accumulation of the next frame (in the diagram, next frame) is started (PD accumulation).

In a period between time t305 and time t307, the signal charges accumulated in the MEM 102 of the pixels 12 in the area 1 are sequentially read out (MEM read-out).

Subsequently, in a period between time t307 and time t308, the signal charges accumulated in the MEM 102 of the pixels 12 in the area 2 are sequentially read out (MEM read-out).

An MEM read-out method from the pixels 12 in the area 1 in the period between time t305 and time t307 and an MEM read-out method from the pixels 12 in the area 2 in the period between time t307 and time t308 are executed in accordance with a timing chart of FIG. 4B.

First, at time t311, the select signal PSEL of the high level is output from the vertical scanning circuit 20 to the select signal line SEL of the pixel row as a target of the read-out. Thus, the select transistors 108 of the pixels 12 which belong to the relevant pixel row are turned on and the pixel row to be read out is selected.

In a period between time t311 and time t312, the reset signal PRES of the high level is output from the vertical scanning circuit 20 to the reset signal line RES of the pixel row as a read-out target, and the FD portion 103 is in a reset state.

Subsequently, when the reset signal PRES is set to the low level at time t312, the reset transistor 106 is turned off and the reset of the FD portion 103 is cancelled. The pixel signal corresponding to the reset level of the FD portion 103 is output to the vertical signal line 16.

Subsequently, in a period between time t312 and time t313, the signal which is output to the vertical signal line 16 and corresponds to the reset level of the FD portion 103 is obtained by the column read-out circuit 30 (hereinbelow, the read-out of the signal corresponding to the reset level is referred to as "N read-out"). A construction of a well-known column read-out circuit can be applied to the column read-out circuit 30. A detailed description of the column read-out circuit 30 is omitted here.

Subsequently, in a period between time t313 and time t314, the second transfer gate control signal PTX2 of the high level is output from the vertical scanning circuit 20 to the second transfer gate signal line TX2 of the pixel row as a read-out target. Thus, the second transfer transistors 105 of the pixels 12 which belong to the relevant pixel row are turned on. The signal charges accumulated in the MEM 102 are transferred to the FD portion 103. Therefore, the signal corresponding to an amount of signal charges accumulated in the MEM 102 is amplified by the amplifier transistor 107 and is output to the vertical signal line 16.

Subsequently, in a period between time t314 and time t315, the signal corresponding to the amount of signal charges output to the vertical signal line 16 is obtained by the column read-out circuit 30 (hereinbelow, the read-out of the signal corresponding to the amount of signal charges is referred to as "S read-out"). By obtaining a difference between the signal obtained by the S read-out and the signal obtained by the N read-out, noise components which are superimposed in common at the time of the S read-out and the N read-out, that is, noise components such as reset noise of the reset transistor 106, threshold voltage variation of the amplifier transistor 107, and the like can be eliminated.

Subsequently, at time t315, the reset signal PRES of the high level is output from the vertical scanning circuit 20 to the reset signal line RES of the pixel row as a read-out target. Thus, the reset transistor 106 is turned on and the FD portion 103 is reset.

Subsequently, at time t316, the select signal PSEL which is output from the vertical scanning circuit 20 to the select signal line SEL is shifted from the high level to the low level. Thus, the select transistors 108 are turned off and the selection of the row is cancelled.

In this manner, in a period between time t311 and time t317, the read-out of the signals of one row of the pixels 12 arranged in a matrix form is completed.

By repeating such an operation the number of times as many as the number of rows in the area 1 while scanning the rows in the area 1 in a period between time t305 and time t307, the pixel signals can be read out of the pixels 12 in the area 1. Assuming that a time between time t311 and time t317 is equal to Th, a time of (Th×the number of rows in the area 1) is equal to a time between time t301 and time t303 and the time between time t305 and time t307 in FIG. 4A.

Similarly, by repeating such an operation the number of times as many as the number of rows in the area 2 while scanning the rows in the area 2 in a period between time t307 and time t308, the pixel signals can be read out of the pixels 12 in the area 2. Assuming that the time between time t311 and time t317 is equal to Th, a time of (Th×the number of rows in the area 2) is equal to a time between time t303 and time t304 and the time between time t307 and time t308 in FIG. 4A. There can also be a case where a part or all of the rows in the area 2 are cyclically read out a plurality of number of times for the read-out period of one frame. In such a case, the rows to be read out in an overlap manner are assumed to be other rows and the number of rows is counted.

In the case of driving in such a manner as mentioned above, it is necessary that the signal charges (an example of electrons will be described here) generated by the PD 101 in the signal accumulating period between time t302 and time t305 can be accumulated in the MEM 102. On the other hand, it is sufficient that the PD 101 can accumulate only the electrons which are generated in a period between time t302 and time t304 serving as a signal read-out period of the previous frame. Therefore, the device can be designed so that the number of saturation electrons in the PD 101 is smaller than that in the MEM 102. Now, assuming that the number of saturation electrons in the PD 101 is equal to Sp, the number of saturation electrons in the MEM 102 is equal to Sm, a time between time t302 and time t305 is equal to Ta, and a time between time t302 and time t304 is equal to Tr, for example, a relation of Sp=Sm×Tr/Ta(<Sm) can be obtained. Since it is sufficient that the number of saturation electrons in the PD 101 is small, by decreasing an area of the PD 101 and allocating a large area to the MEM 102, the number of saturation electrons in the MEM 102 can be increased and a dynamic range can be widened.

However, if the device is designed as mentioned above, there is a case where a picture quality deteriorates in such a situation that strong light enters momentarily. For example, it is now assumed that strong light is irradiated in a period between time t302 and time t304 and electrons of such an amount that the MEM 102 is saturated have been generated in the PD 101. Since only the electrons of the number of saturation electrons can be accumulated in the PD 101, the overflowed electrons are thrown away. Since the number of saturation electrons in the PD 101 is smaller than that in the MEM 102, even if the signal of the PD 101 is transferred to the MEM 102 at time t304, the MEM 102 is not saturated and in spite of a fact that the inherently strong light corresponding to the saturation output entered, the saturation output is not obtained. Since the PD 101 is saturated in a period between time t302 and time t304 and the electrons generated in excess of the number of saturation electrons are thrown away, a deterioration of the picture quality occurs.

From such a viewpoint, in the method of driving the solid-state imaging device according to the present embodiment, the MEM read-out from the pixel 12 in the area 1 is performed earlier than the MEM read-out from the pixel 12 in the area 2. After completion of the MEM read-out from the pixel 12 in the area 1, before the end of the MEM read-out of the pixel 12 in the area 2, the transfer (MEM accumulation) of the signal charges to the MEM 102 from the PD 101 of the pixel 12 in the area 1, that is, the transfer serving as a process for the read-out of the next frame is started. Thus, a period for accumulating the signal charges in the PD 101 of the pixel 12 in the area 1 can be shortened by the time corresponding to a period between time t303 and time t304 serving as a signal read-out period of the pixel 12 in the area 2. Therefore, a possibility that the PD 101 of the pixel 12 in the area 1 is saturated decreases and the deterioration of the picture quality in the area 1 can be reduced.

A period for accumulating the signal charges in the PD 101 of the pixel 12 in the area 2 is equal to a period (between time t302 and time t304) obtained by adding the period for performing the MEM read-out of the area 2 in the previous frame to the period for accumulating the signal charges in the PD 101 of the pixel 12 in the area 1. Therefore, even if the driving method according to the present embodiment is used, the period for accumulating the signal charges in the PD 101 of the pixel 12 in the area 2 is not shortened and, in the area 2, there is no effect of reduction of the foregoing problem. However, if the area 2 is a part or all of the vertical OB area 52 as illustrated in FIG. 3, since the pixel 12 in the area 2 is light-shielded or is a dummy pixel having no PD, there is no anxiety of saturation of the PD 101 of the pixel 12 in the area 2 and the foregoing problem does not occur.

In FIG. 2, it is desirable that each of the charge transfer from the PD 101 to the MEM 102, the charge transfer from the MEM 102 to the FD portion 103, and the charge transfer from the PD 101 to the OFD at the time of resetting the PD 101 is the perfect transfer. This is because the electrons which are not perfectly transferred but remain on the transfer source side become a factor of noises.

In FIG. 4A, as for the pixel 12 in the area 1, the first transfer gate control signal PTX1 is always set to the high level for a period between time t303 and time t305, and as for the pixel 12 in the area 2, the first transfer gate control signal PTX1 is always set to the high level for a period between time t304 and time t305. However, it is sufficient that the signal charges accumulated in the PD 101 are transferred to the MEM 102 before the PD 101 is saturated. The first transfer gate control signal PTX1 may be intermittently set to the high level for a period between time t303 and time t305 or a period between time t304 and time t305. If the first transfer gate control signal PTX1 is always set to the high level, a dark current which is generated from an interfacial defect just under the gate of the first transfer transistor 104 and there is a possibility that the deterioration of the picture quality is caused. If the first transfer transistor 104 is intermittently driven, such a picture quality deterioration can be avoided.

In FIG. 4A, at time t303 or time t304, the first transfer transistors 104 of the pixels 12 in the area 1 or area 2 are turned on in a lump and the charge accumulation into the MEM 102 is simultaneously started. However, it is also possible to construct in such a manner that the first transfer transistors 104 are sequentially turned on from the pixel in which the signal read-out of the previous frame has been finished and the accumulation into the MEM 102 is started. In such a case, with respect to the pixels 12 in the area 1, the first transfer transistors 104 are sequentially turned on in a period between time t301 and time t303, and with respect to the pixels 12 in the area 2, the first transfer transistors 104 are sequentially turned on in a period between time t303 and time t304. Even by such a driving, the foregoing effect of the present embodiment can be obtained. The signal accumulating period is determined by time t302 when the OFD control transistor 109 is turned off and time t302 when the first transfer transistor is turned off irrespective of the timing when the first transfer transistor 104 is turned on. Therefore, even by such a driving, the global electronic shutter can be realized.

As mentioned above, according to the present embodiment, in the solid-state imaging device using the full-pixel simultaneous electronic shutter, the period for accumulating the signal charges only by the photoelectric converting unit can be shortened. Thus, a possibility that an amount of charges which are generated in the photoelectric converting unit exceeds the saturation charge amount decreases and the picture quality deterioration due to the saturation of the photoelectric converting unit can be reduced.

Second Embodiment

A solid-state imaging device and a method of driving the same according to the second embodiment of the present invention will now be described with reference to FIG. 5.

Figure 5:
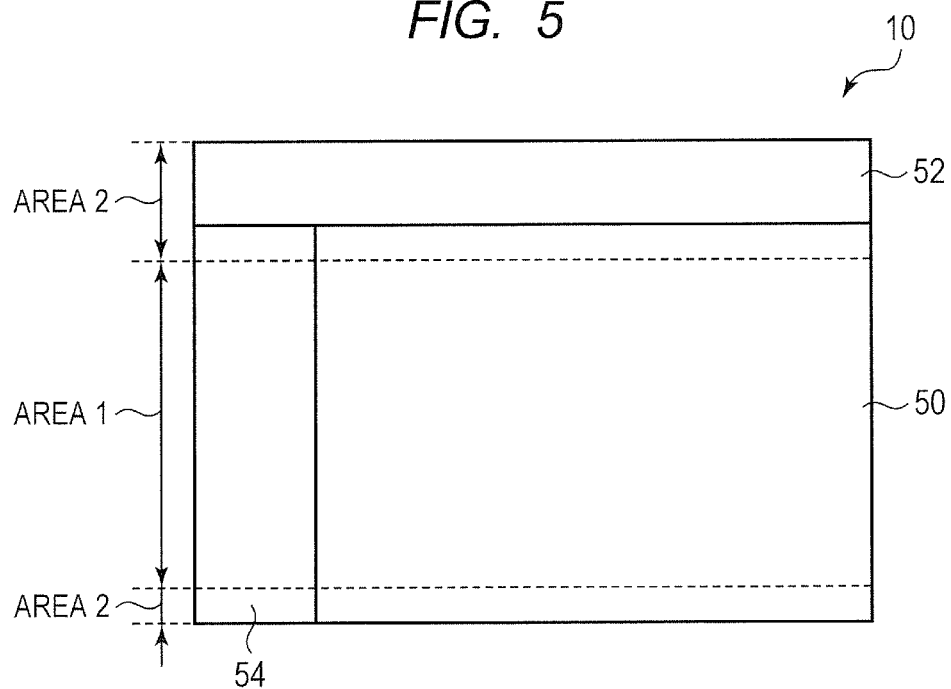
FIG. 5 is a diagram illustrating a construction of a pixel area of a solid-state imaging device according to a second embodiment of the present invention.

FIG. 5 is a diagram illustrating a construction of a pixel area of the solid-state imaging device according to the present embodiment. Component elements similar to those in the solid-state imaging device according to the first embodiment illustrated in FIGS. 1 to 4B are designated by the same reference numerals and their description is omitted or simplified.

The solid-state imaging device and the method of driving the same according to the present embodiment are similar to those according to the first embodiment except for a point that a dividing method of the area 1 and the area 2 in the pixel area 10 differs.

In the first embodiment, as illustrated in FIG. 3, the area including all rows to which the pixels 12 of the valid area 50 belong is set to the area 1 and the area including at least a part of the rows to which the pixels 12 of the vertical OB area 52 belong is set to the area 2.

On the other hand, in the solid-state imaging device according to the present embodiment, the area including a part of the rows to which the pixels 12 of the valid area 50 belong is set to the area 1. The area including all rows to which the pixels 12 of the vertical OB area 52 belong and other rows which are not included in the area 1 among the rows to which the pixels 12 of the valid area 50 belong is set to the area 2. For example, in the example of FIG. 5, together with the rows to which the pixels 12 of the vertical OB area 52 belong, among the rows to which the pixels 12 of the valid area 50 belong, one or a plurality of rows in an upper edge portion and one or a plurality of rows in a lower edge portion are set to the area 2 and a plurality of rows between them are set to the area 1.

As described in the first embodiment, in the area 2, the period for accumulating the signal charges in the PD 101 is not shortened and a possibility that the PD 101 is saturated cannot be reduced. Therefore, if the rows to which the pixels 12 of the valid area 50 belong are included in the area 2, there is a possibility that the saturation of the PD 101 occurs and the picture quality deteriorates. However, even in such a case, by selecting the area where the user wants to prevent the saturation of the PD 101 and setting such an area to the area 1, the picture quality deterioration can be efficiently suppressed.

For example, such a driving method that a light source which flickers and has a possibility that the PD 101 is saturated by the instantaneous light is detected in a real time manner and the rows including the position of the light source are set to the area 1 is considered. By using such a method, even if the rows to which the pixels 12 of the valid area 50 belong are included in the area 2, the picture quality is not deteriorated by the saturation of the PD 101. Therefore, the number of rows which belong to the area 2 is increased, the accumulating period of the signal charges in the PD 101 of the area 1 can be further shortened, and a possibility that the saturation of the PD 101 occurs and the picture quality deteriorates can be further decreased.

In the case of using the driving method according to the present embodiment, it is not always necessary that the vertical OB area 52 is arranged in the area 2.

As mentioned above, according to the present embodiment, in the solid-state imaging device using the full-pixel simultaneous electronic shutter, the period for accumulating the signal charges only by the photoelectric converting unit can be shortened. Thus, a possibility that the amount of charges which are generated in the photoelectric converting unit exceeds the saturation charge amount decreases and the picture quality deterioration due to the saturation of the photoelectric converting unit can be reduced.

Third Embodiment

A solid-state imaging device and a method of driving the same according to a third embodiment of the present invention will now be described with reference to FIGS. 6 to 8D.

Figure 6:
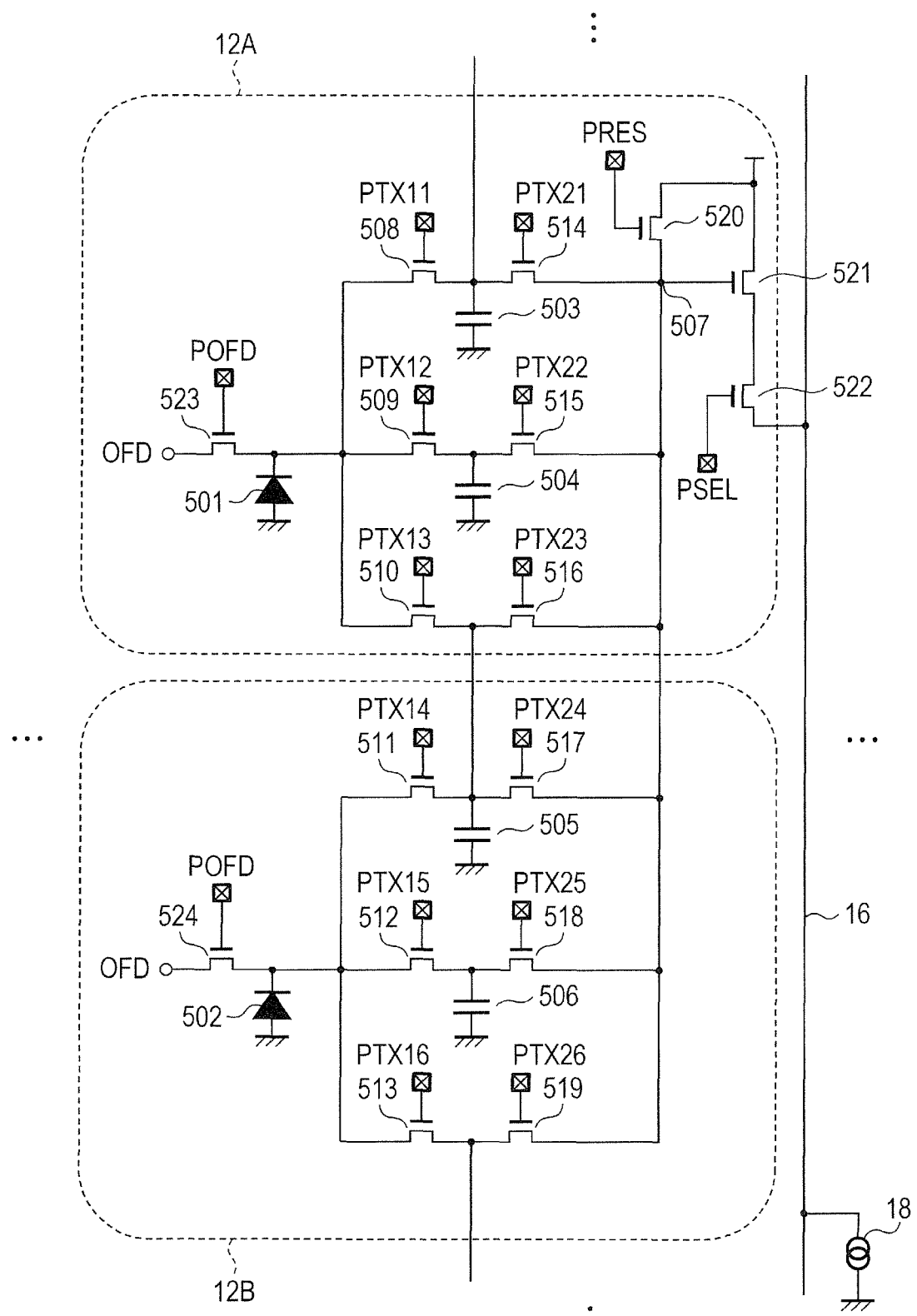
FIG. 6 is a diagram illustrating a circuit construction of pixels of a solid-state imaging device according to a third embodiment of the present invention.

FIG. 6 is a diagram illustrating a circuit construction of pixels of the solid-state imaging device according to the present embodiment. FIGS. 7 to 8D are timing charts illustrating the method of driving the solid-state imaging device according to the present embodiment. Component elements similar to those in the solid-state imaging device according to each of the first and second embodiments illustrated in FIGS. 1 to 5 are designated by the same reference numerals and their description is omitted or simplified.

First, a structure of the solid-state imaging device according to the present embodiment will be described with reference to FIG. 6.

FIG. 6 illustrates the circuit diagram of the two pixels 12 which are adjacent in the column direction among the pixels 12 constructing the pixel area 10 of the solid-state imaging device according to the present embodiment. In this instance, in FIG. 6, it is assumed that the upper pixel 12 is expressed by a pixel 12A and the lower pixel 12 is expressed by a pixel 12B. In the pixel area 10, a set of the two pixels 12A and 12B is assumed to be a fundamental unit and those fundamental units are repeatedly arranged in the row direction and the column direction. In the present embodiment, it is assumed that in the case of showing component elements included in other fundamental units, the corresponding component elements are designated by the same reference numerals or symbols. In the following description, there is a case where such a fundamental unit is also called "unit area."

The pixel 12A includes a PD 501, two MEMs 503 and 504, three first transfer transistors 508, 509, and 510, three second transfer transistors 514, 515, and 516, and an OFD control transistor 523. The pixel 12A also includes a reset transistor 520, an amplifier transistor 521, and a select transistor 522. The pixel 12B includes a PD 502, two MEMs 505 and 506, three first transfer transistors 511, 512, and 513, three second transfer transistors 517, 518, and 519, and an OFD control transistor 524.

An anode of the PD 501 is connected to the ground voltage line and a cathode is connected to sources of the first transfer transistors 508, 509, and 510 and a source of the OFD control transistor 523, respectively. Drains of the first transfer transistors 508, 509, and 510 are connected to sources of the second transfer transistors 514, 515, and 516, respectively. A connection node between the drain of the first transfer transistor 508 and the source of the second transfer transistor 514 constructs the MEM 503. A connection node between the drain of the first transfer transistor 509 and the source of the second transfer transistor 515 constructs the MEM 504. In FIG. 6, the MEMs 503 and 504 are expressed by capacitor.

Similarly, an anode of the PD 502 is connected to the ground voltage line and a cathode is connected to sources of the first transfer transistors 511, 512, and 513 and a source of the OFD control transistor 524, respectively. Drains of the first transfer transistors 511, 512, and 513 are connected to sources of the second transfer transistors 517, 518, and 519, respectively. A connection node between the drain of the first transfer transistor 511 and the source of the second transfer transistor 517 constructs the MEM 505. A connection node between the drain of the first transfer transistor 512 and the source of the second transfer transistor 518 constructs the MEM 506. In FIG. 6, the MEMs 505 and 506 are expressed by capacitor.

A connection node between the drain of the first transfer transistor 510 and the source of the second transfer transistor 516 is connected to a connection node between the drain of the first transfer transistor 511 and the source of the second transfer transistor 517. A connection node between the drain of the first transfer transistor 513 and the source of the second transfer transistor 519 is connected to a connection node between the drain of the first transfer transistor 508 and the source of the second transfer transistor 514 in another unit area which is adjacent in the column direction.

Drains of the second transfer transistors 514, 515, 516, 517, 518, and 519 are connected to a source of the reset transistor 520 and a gate of the amplifier transistor 521. A connection node among the drains of the second transfer transistors 514, 515, 516, 517, 518, and 519, the source of the reset transistor 520, and the gate of the amplifier transistor 521 constructs an FD portion 507. A drain of the reset transistor 520 and a drain of the amplifier transistor 521 are connected to the power voltage line (voltage Vdd). A source of the amplifier transistor 521 is connected to a drain of the select transistor 522. In this manner, in the pixels 12A and 12B, the reset transistor 520, amplifier transistor 521, and select transistor 522 which construct a pixel read-out unit are shared.

First transfer gate signal lines TX11, TX12, TX13, TX14, TX15, and TX16 (not illustrated) each serving as a driving signal line 14 are connected to gates of the first transfer transistors 508, 509, 510, 511, 512, and 513, respectively. First transfer gate control signals PTX11, PTX12, PTX13, PTX14, PTX15, and PTX16 are output from the vertical scanning circuit 20 to the first transfer gate signal lines TX11, TX12, TX13, TX14, TX15, and TX16, respectively. Similarly, second transfer gate signal lines TX21, TX22, TX23, TX24, TX25, and TX26 (not illustrated) each serving as a driving signal line 14 are connected to gates of the second transfer transistors 514, 515, 516, 517, 518, and 519, respectively. Second transfer gate control signals PTX21, PTX22, PTX23, PTX24, PTX25, and PTX26 are output from the vertical scanning circuit 20 to the second transfer gate signal lines TX21, TX22, TX23, TX24, TX25, and TX26, respectively.

Subsequently, the method of driving the solid-state imaging device according to the present embodiment will now be described with reference to FIGS. 7 to 8D. FIG. 7 is a timing chart illustrating the operation in continuous two frame periods. FIGS. 8A to 8D are timing charts illustrating the operation in one horizontal period.

In FIG. 7, each of a period between time t601 and time t608 and a period between time t605 and time t610 is one frame period.

At time t601, the signal charges of the previous frame have been accumulated in the MEMs 503, 504, 505, and 506. Among them, the signal charges accumulated in the MEMs 503 and 504 are sequentially read out in a period between time t601 and time t603 (MEM read-out). An MEM read-out method from the MEMs 503 and 504 is executed in accordance with the timing chart of FIG. 8A, which will be described hereinafter. The signal charges accumulated in the MEMs 505 and 506 are sequentially read out in a period between time t603 and time t604 (MEM read-out). An MEM read-out method from the MEMs 505 and 506 is executed in accordance with the timing chart of FIG. 8B, which will be described hereinafter.

In parallel with those MEM read-out of the previous frame, the next frame period starts from time t601.

At time t601, the first transfer gate control signals PTX11, PTX12, PTX13, PTX14, PTX15, and PTX16 are at the low level and the first transfer transistors 508, 509, 510, 511, 512, and 513 are OFF, respectively.

In a period between time t601 and time t602, the OFD control signal POFD of the high level is output from the vertical scanning circuit 20 to the OFD control signal lines OFD of all rows. Thus, the OFD control transistors 523 and 524 are turned on and the PDs 501 and 502 of all pixels 12 are reset (PD reset).

Subsequently, when the OFD control signal POFD is set to the low level at time t602, the OFD control transistors 523 and 524 are turned off, the reset of the PDs 501 and 502 is cancelled, and the accumulation of the signal charges is simultaneously started in the PDs 501 and 502 in all pixels. In a period between time t602 and time t603, the signal charges generated in the PD 501 are accumulated in the PD 501 and the signal charges generated in the PD 502 are accumulated in the PD 502 (PD accumulation).

Subsequently, in a period between time t603 and time t605, the first transfer gate control signals PTX12 and PTX16 of the high level are output from the vertical scanning circuit 20 to the first transfer gate signal lines TX12 and TX16, respectively. Thus, the first transfer transistors 509 and 513 are turned on, the signal charges accumulated in the PD 501 are transferred to the MEM 504, and the signal charges accumulated in the PD 502 are transferred to the MEM 503 of the adjacent unit area, respectively. At time t603, the MEM read-out from the MEMs 503 and 504 in the previous frame has been finished and the MEMs 503 and 504 are empty. In a period between time t603 and time t604, the first transfer gate control signal PTX12 is always at the high level and the signal charges generated in the PD 501 are immediately transferred to the MEM 504 and accumulated in the MEM 504. Similarly, the first transfer gate control signal PTX16 is always at the high level and the signal charges generated in the PD 502 are immediately transferred to the MEM 503 of the adjacent unit area and accumulated in the MEM 503 of the adjacent unit area (MEM accumulation).

Subsequently, in a period between time t604 and time t605, the first transfer gate control signals PTX13 and PTX15 of the high level are output from the vertical scanning circuit 20 to the first transfer gate signal lines TX13 and TX15, respectively. Thus, the first transfer transistors 510 and 512 are turned on. In a period between time t604 and time t605, the first transfer gate control signals PTX12, PTX13, PTX15, and PTX16 are always at the high level. Therefore, the signal charges generated in the PD 501 are accumulated in the MEMs 504 and 505 and the signal charges generated in the PD 502 are accumulated in the MEM 506 and the MEM 503 of the adjacent unit area (MEM accumulation). At time t604, the MEM read-out from the MEMs 505 and 506 in the previous frame has been finished and the MEMs 505 and 506 are empty.

Subsequently, when the first transfer gate control signals PTX12, PTX13, PTX15, and PTX16 are set to the low level at time t605, the first transfer transistors 509, 510, 512, and 513 are turned off. Thus, the transfer of the signal charges to the MEMs 503, 504, 505, and 506 is simultaneously finished in all pixels 12. By such a driving, in all of the pixels 12, the signals of the aligned accumulating periods of the signal charges can be obtained and the global electronic shutter can be realized.

Subsequently, in a period between time t605 and time t606, the OFD control signal POFD of the high level is output from the vertical scanning circuit 20 to the OFD control signal lines OFD of all of the rows. Thus, the OFD control transistors 523 and 524 are turned on and the PDs 501 and 502 are reset.

Subsequently, when the OFD control signal POFD is set to the low level at time t606, the OFD control transistors 523 and 524 are turned off, the reset of the PDs 501 and 502 is cancelled, and the signal accumulation (PD accumulation) of the next frame is started.

In a period between time t605 and time t607, the signal charges of the previous frame accumulated in the MEMs 504 and 505 are sequentially read out. An MEM read-out method from the MEMs 504 and 505 is executed in accordance with the timing chart of FIG. 8C, which will be described hereinafter.

Subsequently, in a period between time t607 and time t608, the signal charges of the previous frame accumulated in the MEMs 503 and 506 are sequentially read out. An MEM read-out method from the MEMs 503 and 506 is executed in accordance with the timing chart of FIG. 8D, which will be described hereinafter.

Subsequently, in a period between time t607 and time t609, the first transfer gate control signals PTX12 and PTX14 of the high level are output from the vertical scanning circuit 20 to the first transfer gate signal lines TX12 and TX14, respectively. Thus, the first transfer transistors 509 and 511 are turned on, the signal charges accumulated in the PD 501 are transferred to the MEM 504, and the signal charges accumulated in the PD 502 are transferred to the MEM 505, respectively. At time t607, the MEM read-out from the MEMs 504 and 505 in the previous frame has been finished and the MEMs 504 and 505 are empty.

Subsequently, in a period between time t608 and time t609, the first transfer gate control signals PTX11 and PTX15 of the high level are output from the vertical scanning circuit 20 to the first transfer gate signal lines TX11 and TX15, respectively. Thus, the first transfer transistors 508 and 512 are turned on. In a period between time t608 and time t609, the first transfer gate control signals PTX11, PTX12, PTX14, and PTX15 are always at the high level. Therefore, the signal charges generated in the PD 501 are accumulated in the MEMs 503 and 504 and the signal charges generated in the PD 502 are accumulated in the MEMs 505 and 506 (MEM accumulation). At time t608, the MEM read-out from the MEMs 503 and 506 in the previous frame has been finished and the MEMs 503 and 506 are empty.

Subsequently, when the first transfer gate control signals PTX11, PTX12, PTX14, and PTX15 are set to the low level at time t609, the first transfer transistors 508, 509, 511, and 512 are turned off. Thus, the transfer of the signal charges to the MEMs 503, 504, 505, and 506 is simultaneously finished in all pixels 12.

After time t609, the operation in a period between time t601 and time t609 is repeatedly executed.

An MEM read-out method from the MEMs 503 and 504 in a period between time t601 and time t603 is executed in accordance with the timing chart of FIG. 8A.

First, at time t611, the select signal PSEL is output from the vertical scanning circuit 20 to the select signal line SEL of the pixel row as a read-out target. Thus, the select transistor 522 of the pixel 12 which belongs to the relevant pixel row is turned on and the pixel row to be read out is selected.

In a period between time t611 and time t612, the reset signal PRES of the high level is output from the vertical scanning circuit 20 to the reset signal line RES of the pixel row as a read-out target and the FD portion 507 is in a reset state.

Subsequently, when the reset signal PRES is set to the low level at time t612, the reset transistor 520 is turned off and the reset of the FD portion 507 is cancelled. The pixel signal corresponding to the reset level of the FD portion 507 is output to the vertical signal line 16.

Subsequently, in a period between time t612 and time t613, the signal corresponding to the reset level of the FD portion 507 which was output to the vertical signal line 16 is obtained by the column read-out circuit 30 (N read-out).

Subsequently, in a period between time t613 and time t614, the second transfer gate control signals PTX21 and PTX22 of the high level are output from the vertical scanning circuit 20 to the second transfer gate signal lines TX21 and TX22 of the pixel row as a read-out target. Thus, the second transfer transistors 514 and 515 of the pixel 12 which belongs to the relevant pixel row are turned on and the signal charges accumulated in the MEMs 503 and 504 are transferred to the FD portion 507. Therefore, the signal corresponding to the total amount of the signal charges accumulated in the MEM 503 and the signal charges accumulated in the MEM 504 is amplified by the amplifier transistor 521 and is output to the vertical signal line 16.

Subsequently, in a period between time t614 and time t615, the signal corresponding to the amount of the signal charges output to the vertical signal line 16 is obtained by the column read-out circuit 30 (S read-out). By obtaining a difference between the signal obtained by the S read-out and the signal obtained by the N read-out, noise components which are superimposed in common at the time of the S read-out and the N read-out, that is, noise components such as reset noises of the reset transistor 106, a threshold voltage variation of the amplifier transistor 107, and the like can be eliminated.

Subsequently, at time t615, the reset signal PRES of the high level is output from the vertical scanning circuit 20 to the reset signal line RES of the pixel row as a read-out target. Thus, the reset transistor 520 is turned on and the FD portion 507 is reset.

Subsequently, at time t616, the select signal PSEL which is output from the vertical scanning circuit 20 to the select signal line SEL is shifted from the high level to the low level. Thus, the select transistor 522 is turned off and the selection of the row is cancelled.

In this manner, in a period between time t611 and time t617, the read-out of the signals of one row of the pixels 12 arranged in a matrix form is completed. By repeating such an operation the number of times as many as ½ of the number of rows of all pixel areas while scanning the read-out rows every other row, the signals accumulated in the MEMs 503 and 504 in all pixel areas can be read out. Now, assuming that a time between time t611 and time t617 is equal to Th_2, (Th_2×the number of rows of all pixel areas×½) is equal to a time between time t601 and time t603 in FIG. 7.

An MEM read-out method from the MEMs 505 and 506 in a period between time t603 and time t604 is executed in accordance with the timing chart of FIG. 8B. The driving in a period between time t621 and time t627 is substantially the same as that in a period between time t611 and time t617 in FIG. 8A except for the driving in a period between time t623 and time t624.

In a period between time t623 and time t624, the second transfer gate control signals PTX24 and PTX25 of the high level are output from the vertical scanning circuit 20 to the second transfer gate signal lines TX24 and TX25 of the pixel row as a read-out target. Thus, the second transfer transistors 517 and 518 of the pixel 12 which belongs to the relevant pixel row are turned on and the signal charges accumulated in the MEMs 505 and 506 are transferred to the FD portion 507. Therefore, the signal corresponding to the total amount of the signal charges accumulated in the MEM 505 and the signal charges accumulated in the MEM 506 is amplified by the amplifier transistor 521 and is output to the vertical signal line 16.

By repeating the operation in a period between time t621 and time t627 the number of times as many as ½ of the number of rows of all pixel areas while scanning the read-out rows every other row, the signals accumulated in the MEMs 505 and 506 in all pixel areas can be read out.

An MEM read-out method from the MEMs 504 and 505 in a period between time t605 and time t607 is executed in accordance with the timing chart of FIG. 8C. The driving in a period between time t631 and time t637 is substantially the same as that in a period between time t611 and time t617 in FIG. 8A except for the driving in a period between time t633 and time t634.

In a period between time t633 and time t634, the second transfer gate control signals PTX22 and PTX23 of the high level are output from the vertical scanning circuit 20 to the second transfer gate signal lines TX22 and TX23 of the pixel row as a read-out target. Thus, the second transfer transistors 515 and 516 of the pixel 12 which belongs to the relevant pixel row are turned on and the signal charges accumulated in the MEMs 504 and 505 are transferred to the FD portion 507. Therefore, the signal corresponding to the total amount of the signal charges accumulated in the MEM 504 and the signal charges accumulated in the MEM 505 is amplified by the amplifier transistor 521 and is output to the vertical signal line 16.

By repeating the operation in a period between time t631 and time t637 the number of times as many as ½ of the number of rows of all pixel areas while scanning the read-out rows every other row, the signals accumulated in the MEMs 504 and 505 in all pixel areas can be read out.

An MEM read-out method from the MEMs 506 and 503 in a period between time t607 and time t608 is executed in accordance with the timing chart of FIG. 8D. The driving in a period between time t641 and time t647 is substantially the same as that in a period between time t611 and time t617 in FIG. 8A except for the driving in a period between time t643 and time t644.

In a period between time t643 and time t644, the second transfer gate control signals PTX25 and PTX26 of the high level are output from the vertical scanning circuit 20 to the second transfer gate signal lines TX25 and TX26 of the pixel row as a read-out target. Thus, the second transfer transistors 518 and 519 of the pixel 12 which belongs to the relevant pixel row are turned on and the signal charges accumulated in the MEMs 506 and 503 are transferred to the FD portion 507. Therefore, the signal corresponding to the total amount of the signal charges accumulated in the MEM 506 and the signal charges accumulated in the MEM 503 is amplified by the amplifier transistor 521 and is output to the vertical signal line 16.

By repeating the operation in a period between time t641 and time t647 the number of times as many as ½ of the number of rows of all pixel areas while scanning the read-out rows every other row, the signals accumulated in the MEMs 506 and 503 in all pixel areas can be read out.

In the solid-state imaging device according to the present embodiment, two MEMs are prepared per pixel and, at a point of time when the read-out of the signals of the pixels of the number as many as ½ of the number of all rows, the signal accumulation of the different two pixels is started to each of the two MEMs in which the signals of the same pixel have been accumulated. By this method, in all pixels, the PD accumulating period (between time t601 and time t603 and between time t605 and time t607) can be shortened to ½ of the signal read-out period (between time t601 and time t604 and between time t605 and time t608).

To realize such a driving, in the present embodiment, a combination of the MEMs adapted to accumulate the signals in the PDs 501 and 502 in a period between time t604 and time t605 and that in a period between time t608 and time t609 are made different. In other words, in the period between time t604 and time t605, the signals in the PD 501 are accumulated in the MEMs 504 and 505 and the signals in the PD 502 are accumulated in the MEMs 503 and 506. On the other hand, in the period between time t608 and time t609, the signals in the PD 501 are accumulated in the MEMs 503 and 504 and the signals in the PD 502 are accumulated in the MEMs 505 and 506.

In FIG. 7, at time t603, t604, t607, and t608, the first transfer transistors of all pixel areas are turned on in a lump and the signal accumulation in the MEMs is started. However, in a manner similar to that in the first embodiment, the first transfer transistors may be sequentially turned on from the pixel in which the signal read-out of the previous frame has been finished.

In FIG. 7, in a period during which the first transfer gate control signals PTX11 to PTX16 are at the high level, it is not always necessary that those signals are always set to the high level, but they may be intermittently set to the high level to such an extent that the PDs 501 and 502 are not saturated.

In the circuit illustrated in FIG. 6, one reset transistor 520, one amplifier transistor 521, and one select transistor 522 are shared in the two pixels 12. However, in the present embodiment, such a construction is not essential but these transistors may be formed per pixel or they may be shared in three or more pixels.

The present embodiment can be also realized by combining with the first embodiment. That is, the pixel area 10 in which the pixels 12A and 12B in the present embodiment are arranged in a matrix form is divided into an area 1 and an area 2 and the pixel 12 in the area 1 is read out of earlier than the pixel 12 in the area 2 by using the driving method according to the present embodiment. By driving as mentioned above, the period during which the signals are accumulated in the PD of the pixel in the area 1 can be shortened to ½ of the signal read-out period in the area 1. Consequently, a possibility that the PD is saturated in the read-out period can be further reduced than that in the case of the first embodiment.

In the present embodiment, the construction in which two MEMs are provided for one pixel has been described. On the basis of a similar idea, if N (N is an integer of 2 or more) MEMs are provided for one pixel, the period during which the signals are accumulated in the PD can be shortened to 1/N of the signal read-out period in principle. That is, at a point of time when the signal read-out of 1/N of all pixels has been finished, the signal accumulation of the N different pixels is started to each of the N MEMs in which the signals of the same pixel have been accumulated. Thus, after the elapse of 1/N of the signal read-out period, the signal accumulation by the MEM can be started with respect to all pixels.

As mentioned above, by the circuit construction and driving of the present embodiment, the period during which the signals are accumulated in the PD can be shortened and the picture quality deterioration which occurs since the PD is saturated in the signal read-out period can be reduced.

As mentioned above, according to the present embodiment, in the solid-state imaging device using the full-pixel simultaneous electronic shutter, the period during which the signal charges are accumulated only by the photoelectric converting unit can be shortened. Thus, a possibility that an amount of charges generated in the photoelectric converting unit exceeds the saturation charge amount decreases and the picture quality deterioration due to the saturation of the photoelectric converting unit can be reduced.

Fourth Embodiment

A solid-state imaging device and a method of driving the same according to a fourth embodiment of the present invention will now be described with reference to FIGS. 9 to 10B.

Figure 9:
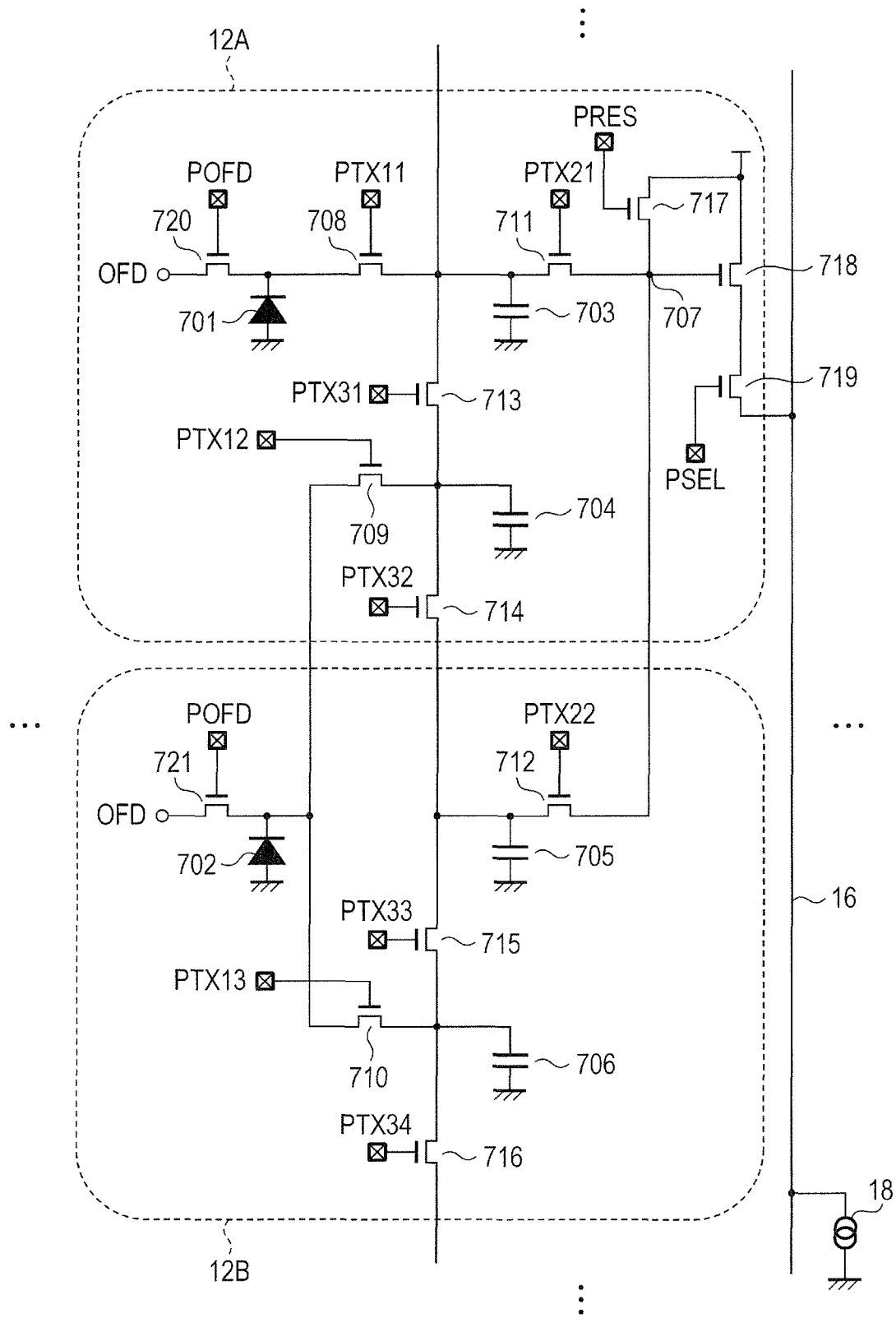
FIG. 9 is a diagram illustrating a circuit construction of pixels of a solid-state imaging device according to a fourth embodiment of the present invention.

FIG. 9 is a diagram illustrating a circuit construction of pixels of the solid-state imaging device according to the present embodiment. FIGS. 10A and 10B are timing charts illustrating the method of driving the solid-state imaging device according to the present embodiment. Component elements similar to those in the solid-state imaging device according to each of the first to third embodiments illustrated in FIGS. 1 to 8D are designated by the same reference numerals and their description is omitted or simplified.

First, a structure of the solid-state imaging device according to the present embodiment will be described with reference to FIG. 9.

FIG. 9 illustrates a circuit diagram of the two pixels 12 which are adjacent in the column direction among the pixels 12 constructing the pixel area 10 of the solid-state imaging device according to the present embodiment. In this instance, in FIG. 9, for convenience of explanation, it is assumed that the upper pixel 12 is expressed by the pixel 12A and the lower pixel 12 is expressed by the pixel 12B.

In the pixel area 10, a set of two pixels 12A and 12B is assumed to be a fundamental unit and those fundamental units are repeatedly arranged in the row direction and the column direction. In the present embodiment, it is assumed that in the case of showing component elements included in other fundamental units, the corresponding component elements are designated by the same reference numerals or symbols.

The pixel 12A includes a PD 701, two MEMs 703 and 704, two first transfer transistors 708 and 709, a second transfer transistor 711, two third transfer transistors 713 and 714, and an OFD control transistor 720. The pixel 12A also includes a reset transistor 717, an amplifier transistor 718, and a select transistor 719. The pixel 12B includes a PD 702, two MEMs 705 and 706, a first transfer transistor 710, a second transfer transistor 712, two third transfer transistors 715 and 716, and an OFD control transistor 721.

An anode of the PD 701 is connected to a ground voltage line and a cathode is connected to a source of the first transfer transistor 708 and a source of the OFD control transistor 720. A drain of the first transfer transistor 708 is connected to a source of the second transfer transistor 711 and a source of the third transfer transistor 713. A connection node among the drain of the first transfer transistor 708, the source of the second transfer transistor 711, and the source of the third transfer transistor 713 constructs the MEM 703. A drain of the first transfer transistor 709 is connected to a drain of the third transfer transistor 713 and a source of the third transfer transistor 714. A connection node among the drain of the first transfer transistor 709, the drain of the third transfer transistor 713, and the source of the third transfer transistor 714 constructs the MEM 704. In FIG. 9, the MEMs 703 and 704 are expressed by capacitor.

An anode of the PD 702 is connected to the ground voltage line and a cathode is connected to a source of the first transfer transistor 709, a source of the first transfer transistor 710, and a source of the OFD control transistor 721. A drain of the first transfer transistor 710 is connected to a source of the third transfer transistor 715 and a drain of the third transfer transistor 716. A drain of the third transfer transistor 715 is connected to a drain of the third transfer transistor 714 and a source of the second transfer transistor 712. A connection node among the drain of the third transfer transistor 715, the drain of the third transfer transistor 714, and the source of the second transfer transistor 712 constructs the MEM 705. A connection node among the drain of the first transfer transistor 710, the source of the third transfer transistor 715, and the drain of the third transfer transistor 716 constructs the MEM 706. In FIG. 9, the MEMs 705 and 706 are expressed by capacitor.

A connection node among the drain of the first transfer transistor 708, the source of the second transfer transistor 711, and the source of the third transfer transistor 713 is connected to a source of the third transfer transistor 716 of another unit area which is adjacent in the column direction.

Drains of the second transfer transistor 711 and 712 are connected to a source of the reset transistor 717 and a gate of the amplifier transistor 718. A connection node among the drains of the second transfer transistors 711 and 712, the source of the reset transistor 717, and the gate of the amplifier transistor 718 constructs an FD portion 707. A drain of the reset transistor 717 and a drain of the amplifier transistor 718 are connected to the power voltage line (voltage Vdd). A source of the amplifier transistor 718 is connected to a drain of the select transistor 719. In this manner, in the pixels 12A and 12B, the reset transistor 717, amplifier transistor 718, and select transistor 719 which construct a pixel read-out unit are shared.

The first transfer gate signal lines TX11, TX12, and TX13 (not illustrated) each serving as a driving signal line 14 are connected to gates of the first transfer transistors 708, 709, and 710, respectively. The first transfer gate control signals PTX11, PTX12, and PTX13 are output from the vertical scanning circuit 20 to the first transfer gate signal lines TX11, TX12, and TX13, respectively. The second transfer gate signal lines TX21 and TX22 (not illustrated) each serving as a driving signal line 14 are connected to gates of the second transfer transistors 711 and 712, respectively. The second transfer gate control signals PTX21 and PTX22 are output from the vertical scanning circuit 20 to the second transfer gate signal lines TX21 and TX22, respectively. Similarly, third transfer gate signal lines TX31, TX32, TX33, and TX34 (not illustrated) each serving as a driving signal line 14 are connected to gates of the third transfer transistors 713, 714, 715, and 716, respectively. Third transfer gate control signals PTX31, PTX32, PTX33, and PTX34 are output from the vertical scanning circuit 20 to the third transfer gate signal lines TX31, TX32, TX33, and TX34, respectively.

Subsequently, the method of driving the solid-state imaging device according to the present embodiment will now be described with reference to FIGS. 10A to 10C. FIG. 10A is a timing chart illustrating the operation in continuous two frame periods. FIGS. 10B and 10C are timing charts illustrating the operation in one horizontal period.

In FIG. 10A, each of a period between time t801 and time t808 and a period between time t805 and time t810 is one frame period.

At time t801, the signal charges of the previous frame have been accumulated in the MEMs 703, 704, 705, and 706. Among them, the signal charges accumulated in the MEMs 703 and 704 are sequentially read out in a period between time t801 and time t803 (MEM read-out). An MEM read-out method from the MEMs 703 and 704 is executed in accordance with the timing chart of FIG. 10B, which will be described hereinafter. The signal charges accumulated in the MEMs 705 and 706 are sequentially read out in a period between time t803 and time t804 (MEM read-out). An MEM read-out method from the MEMs 705 and 706 is executed in accordance with the timing chart of FIG. 10C, which will be described hereinafter.

In parallel with those MEM read-out of the previous frame, the next frame period starts from time t801.

At time t801, the first transfer gate control signals PTX11, PTX12, and PTX13 are at the low level and the first transfer transistors 708, 709, and 710 are OFF. The third transfer gate control signals PTX32 and PTX34 are at the low level and the third transfer transistors 714 and 716 are OFF. The third transfer gate control signals PTX31 and PTX33 are at the high level and the third transfer transistors 713 and 715 are ON.

In a period between time t801 and time t802, the OFD control signal POFD of the high level is output from the vertical scanning circuit 20 to the OFD control signal lines OFD of all rows. Thus, the OFD control transistors 720 and 721 are turned on and the PDs 701 and 702 of all of the pixels 12 are reset (PD reset).

Subsequently, when the OFD control signal POFD is set to the low level at time t802, the OFD control transistors 720 and 721 are turned off, the reset of the PDs 701 and 702 is cancelled, and the accumulation of the signal charges is simultaneously started in the PDs 701 and 702 with respect to all of the pixels. In a period between time t802 and time t803, the signal charges generated in the PD 701 are accumulated into the PD 701 and the signal charges generated in the PD 702 are accumulated into the PD 702 (PD accumulation).

Subsequently, at time t803, the third transfer gate control signal PTX31 is shifted from the high level to the low level by the vertical scanning circuit 20 and the third transfer transistor 713 is turned off. In a period between time t803 and time t805, the first transfer gate control signals PTX11 and PTX12 of the high level are output from the vertical scanning circuit 20 to the first transfer gate signal lines TX11 and TX12. Thus, the first transfer transistors 708 and 709 are turned on and the signal charges accumulated in the PD 701 are transferred to the MEM 703 and the signal charges accumulated in the PD 702 are transferred to the MEM 704, respectively. At time t803, the MEM read-out from the MEMs 703 and 704 in the previous frame has been finished and the MEMs 703 and 704 are empty. In a period between time t803 and time t804, the first transfer gate control signal PTX11 is always at the high level, and the signal charges generated in the PD 701 are immediately transferred to the MEM 703 and are accumulated in the MEM 703. Similarly, the first transfer gate control signal PTX12 is always at the high level, and the signal charges generated in the PD 702 are immediately transferred to the MEM 704 and are accumulated in the MEM 704 (MEM accumulation).

Subsequently, at time t804, the third transfer gate control signal PTX33 is shifted from the high level to the low level by the vertical scanning circuit 20 and the third transfer transistor 715 is turned off. In a period between time t804 and time t808, the third transfer gate control signal PTX32 of the high level is output from the vertical scanning circuit 20 to the third transfer gate signal line TX32. In a period between time t804 and time t807, the third transfer gate control signal PTX34 of the high level is output from the vertical scanning circuit 20 to the third transfer gate signal line TX34. Thus, the third transfer transistors 714 and 716 are turned on. In a period between time t804 and time t805, the first transfer gate control signals PTX11 and PTX12 and the third transfer gate control signals PTX32 and PTX34 are always at the high level. Therefore, the signal charges generated in the PD 701 are accumulated in the MEM 703 and in the MEM 706 of the adjacent unit area and the signal charges generated in the PD 702 are accumulated in the MEMs 704 and 705 (MEM accumulation). At time t804, the MEM read-out from the MEMs 705 and 706 in the previous frame has been finished and the MEMs 705 and 706 are empty.

Subsequently, when the first transfer gate control signals PTX11 and PTX12 are set to the low level at time t805, the first transfer transistors 708 and 709 are turned off. Thus, the transfer of the signal charges to the MEMs 703, 704, 705, and 706 is simultaneously finished in all pixels 12. By such a driving, in all of the pixels 12, the signals of the aligned accumulating periods of the signal charges can be obtained and the global electronic shutter can be realized.

Subsequently, in a period between time t805 and time t806, the OFD control signal POFD of the high level is output from the vertical scanning circuit 20 to the OFD control signal lines OFD of all of the rows. Thus, the OFD control transistors 720 and 721 are turned on and the PDs 701 and 702 are reset.

Subsequently, when the OFD control signal POFD is set to the low level at time t806, the OFD control transistors 720 and 721 are turned off, the reset of the PDs 701 and 702 is cancelled, and the signal accumulation of the next frame (PD accumulation) is started.

In a period between time t805 and time t807, the signal charges of the previous frame accumulated in the MEMs 703 and 706 are sequentially read out. An MEM read-out method from the MEMs 703 and 706 is executed in accordance with the timing chart of FIG. 10B, which will be described hereinafter.

Subsequently, in a period between time t807 and time t808, the signal charges of the previous frame accumulated in the MEMs 704 and 705 are sequentially read out. An MEM read-out method from the MEMs 704 and 705 is executed in accordance with the timing chart of FIG. 10C, which will be described hereinafter.

Subsequently, when the third transfer gate control signal PTX34 is set to the low level at time t807, the third transfer transistor 716 is turned off. In a period between time t807 and time t809, the first transfer gate control signals PTX11 and PTX13 of the high level are output from the vertical scanning circuit 20 to the first transfer gate signal lines TX11 and TX13. Thus, the first transfer transistors 708 and 710 are turned on, the signal charges in the PD 701 are transferred to the MEM 703, and the signal charges in the PD 702 are transferred to the MEM 706, respectively. At time t807, the MEM read-out from the MEMs 703 and 706 in the previous frame has been finished and the MEMs 703 and 706 are empty.

Subsequently, when the third transfer gate control signal PTX32 is set to the low level at time t808, the third transfer transistor 714 is turned off. The third transfer gate control signals PTX31 and PTX33 are shifted from the low level to the high level and the third transfer transistors 713 and 715 are turned on. Thus, the signal charges generated in the PD 701 are accumulated in the MEMs 703 and 704 and the signal charges generated in the PD 702 are accumulated in the MEMs 705 and 706. At time t808, the MEM read-out from the MEMs 704 and 705 in the previous frame has been finished and the MEMs 704 and 705 are empty.

Subsequently, when the first transfer gate control signals PTX11 and PTX13 are set to the low level at time t809, the first transfer transistors 708 and 710 are turned off. Thus, the transfer of the signal charges to the MEMs 703, 704, 705, and 706 is simultaneously finished in all pixels.

After time t809, the driving in a period between time t801 and time t809 is repeatedly executed.

An MEM read-out method in a period between time t801 and time t803 and a period between time t805 and time t807 is executed in accordance with the timing chart of FIG. 10B.

First, at time t811, the select signal PSEL of the high level is output from the vertical scanning circuit 20 to the select signal line SEL of the pixel row as a read-out target. Thus, the select transistors 719 of the pixels 12 which belong to the relevant pixel row is turned on and the pixel row to be read out is selected.

In a period between time t811 and time t812, the reset signal PRES of the high level is output from the vertical scanning circuit 20 to the reset signal line RES of the pixel row as a read-out target, and the FD portion 707 is in a reset state.

Subsequently, when the reset signal PRES is set to the low level at time t812, the reset transistor 717 is turned off and the reset of the FD portion 707 is cancelled. The pixel signal corresponding to the reset level of the FD portion 707 is output to the vertical signal line 16.

Subsequently, in a period between time t812 and time t813, the signal which is output to the vertical signal line 16 and corresponds to the reset level of the FD portion 707 is obtained by the column read-out circuit 30 (N read-out).

Subsequently, in a period between time t813 and time t814, the second transfer gate control signal PTX21 of the high level is output from the vertical scanning circuit 20 to the second transfer gate signal line TX21 of the pixel row as a read-out target. Thus, the second transfer transistor 711 of the pixel 12 which belongs to the relevant pixel row is turned on. The signal charges accumulated in the MEMs 703 and 704 or the signal charges accumulated in the MEMs 703 and 706 are transferred to the FD portion 707 in accordance with the ON/OFF states of the third transfer transistors 713 and 716. The signal corresponding to the total amount of the signal charges transferred to the FD portion 707 is amplified by the amplifier transistor 718 and is output to the vertical signal line 16.

Subsequently, in a period between time t814 and time t815, the signal corresponding to the amount of signal charges output to the vertical signal line 16 is obtained by the column read-out circuit 30 (S read-out). By obtaining a difference between the signal obtained by the S read-out and the signal obtained by the N read-out, noise components which are superimposed in common at the time of the S read-out and the N read-out, that is, noise components such as reset noise of the reset transistor 717, threshold voltage variation of the amplifier transistor 718, and the like can be eliminated.

Subsequently, at time t815, the reset signal PRES of the high level is output from the vertical scanning circuit 20 to the reset signal line RES of the pixel row as a read-out target. Thus, the reset transistor 717 is turned on and the FD portion 707 is reset.

Subsequently, at time t816, the select signal PSEL which is output from the vertical scanning circuit 20 to the select signal line SEL is shifted from the high level to the low level. Thus, the select transistor 719 is turned off and the selection of the row is cancelled.

In this manner, in a period between time t811 and time t817, the read-out of the signals of one row of the pixels 12 arranged in a matrix form is completed. By repeating such an operation the number of times as many as ½ of the number of rows of all pixel areas while scanning the read-out rows every other row, the signals accumulated in the MEMs 703 and 704 or the signals accumulated in the MEMs 703 and 706 in all pixel areas can be read out. Now, assuming that a time between time t811 and time t817 is equal to Th_3, (Th_3×the number of rows of all pixel areas×½) is equal to a time between time t801 and time t803 and a time between time t805 and time t807 in FIG. 10A.

An MEM read-out method in a period between time t803 and time t804 and a period between time t807 and time t808 is executed in accordance with the timing chart of FIG. 10C. The driving in a period between time t821 and time t827 is substantially the same as that in a period between time t811 and time t817 in FIG. 10B except for the driving in a period between time t823 and time t824.

In a period between time t823 and time t824, the second transfer gate control signal PTX22 of the high level is output from the vertical scanning circuit 20 to the second transfer gate signal line TX22 of the pixel row as a read-out target. Thus, the second transfer transistor 712 of the pixel 12 which belongs to the relevant pixel row is turned on. The signal charges accumulated in the MEMs 704 and 705 or the signal charges accumulated in the MEMs 705 and 706 are transferred to the FD portion 707 in accordance with the ON/OFF states of the third transfer transistors 714 and 715. The signal corresponding to the total amount of the signal charges transferred to the FD portion 707 is amplified by the amplifier transistor 718 and is output to the vertical signal line 16.

The operation in a period between time t821 and time t827 is repeated the number of times as many as ½ of the number of rows of all pixel areas while scanning the read-out rows every other row. Thus, the signals accumulated in the MEMs 704 and 705 or the signals accumulated in the MEMs 705 and 706 in all pixel areas can be read out.

Also in the present embodiment, in a manner similar to the case of the second embodiment, the period during which the signal charges are accumulated in the PD can be shortened to ½ of the signal read-out period. By executing the present embodiment in combination with the first embodiment, an effect similar to that described in the second embodiment can be obtained.

In FIG. 10A, at time t803, t804, t807, and t808, ON/OFF of the first transfer transistors or the third transfer transistors in all pixel areas are switched in a lump and the signal accumulation in the MEMs is started. However, ON/OFF of the first transfer transistors or the third transfer transistors may be switched from the pixel in which the signal read-out of the previous frame has been finished.

In FIG. 10A, it is unnecessary that the first transfer gate control signals PTX11 to PTX13 and the third transfer gate control signals PTX31 to PTX34 are always set to the high level but they may be intermittently set to the high level.

In the present embodiment, when the signal charges accumulated in the MEMs 704 and 706 are transferred to the FD portion 707, they certainly pass through the MEM 703 or 705. Therefore, it is desirable that the signal charges can be perfectly transferred from the MEMs 704 and 706 to the MEMs 703 and 705. For this purpose, it is effective that an impurity concentration of a semiconductor region forming each of the MEMs 703 and 705 is set to be higher than that of each of the MEMs 704 and 706 or a potential is designed so that the signal charges are not trapped to portions under the gates of the third transfer transistors 713 to 716.

In the pixel circuit of the solid-state imaging device according to the present embodiment illustrated in FIG. 9, the number of second transfer transistors which are connected to FD portion is smaller than that in the pixel circuit of the second embodiment illustrated in FIG. 6. Therefore, a capacitance between the gate and drain and a junction capacitance of the drain of the second transfer transistor which are parasitic to the FD portion can be reduced and an FD capacitance can be suppressed to a small value. Assuming that a signal charge amount is equal to Q and an FD capacitance is equal to Cfd, a signal voltage on the FD portion is expressed by Q/Cfd. The smaller the FD capacitance Cfd is, the larger the signal voltage on the FD portion is and the more it is difficult to be influenced by the noises which are superimposed by the reading-out circuit at the post stage. In other words, according to the present embodiment in which the FD capacitance can be reduced, an S/N ratio higher than that in the second embodiment can be realized.

Although the reset transistor 717, amplifier transistor 718, and select transistor 719 are shared by two pixels in the pixel circuit of FIG. 9, those transistors may be formed one by one per pixel. According to such a construction, since the number of second transfer transistors connected to the FD portion is equal to 1, the FD capacitance can be further reduced and the higher S/N ratio can be expected.

As mentioned above, according to the solid-state imaging device of the present embodiment, in addition to the effect obtained by the solid-state imaging device according to the third embodiment, the higher S/N ratio can be accomplished.

As mentioned above, according to the present embodiment, in the solid-state imaging device using the full-pixel simultaneous electronic shutter, the period during which the signal charges are accumulated only by the photoelectric converting unit can be shortened. Thus, a possibility that an amount of charges generated in the photoelectric converting unit exceeds the saturation charge amount decreases and the picture quality deterioration due to the saturation of the photoelectric converting unit can be reduced.

Fifth Embodiment

An imaging system according to a fifth embodiment of the present invention will now be described with reference to FIG. 11.

Figure 11:
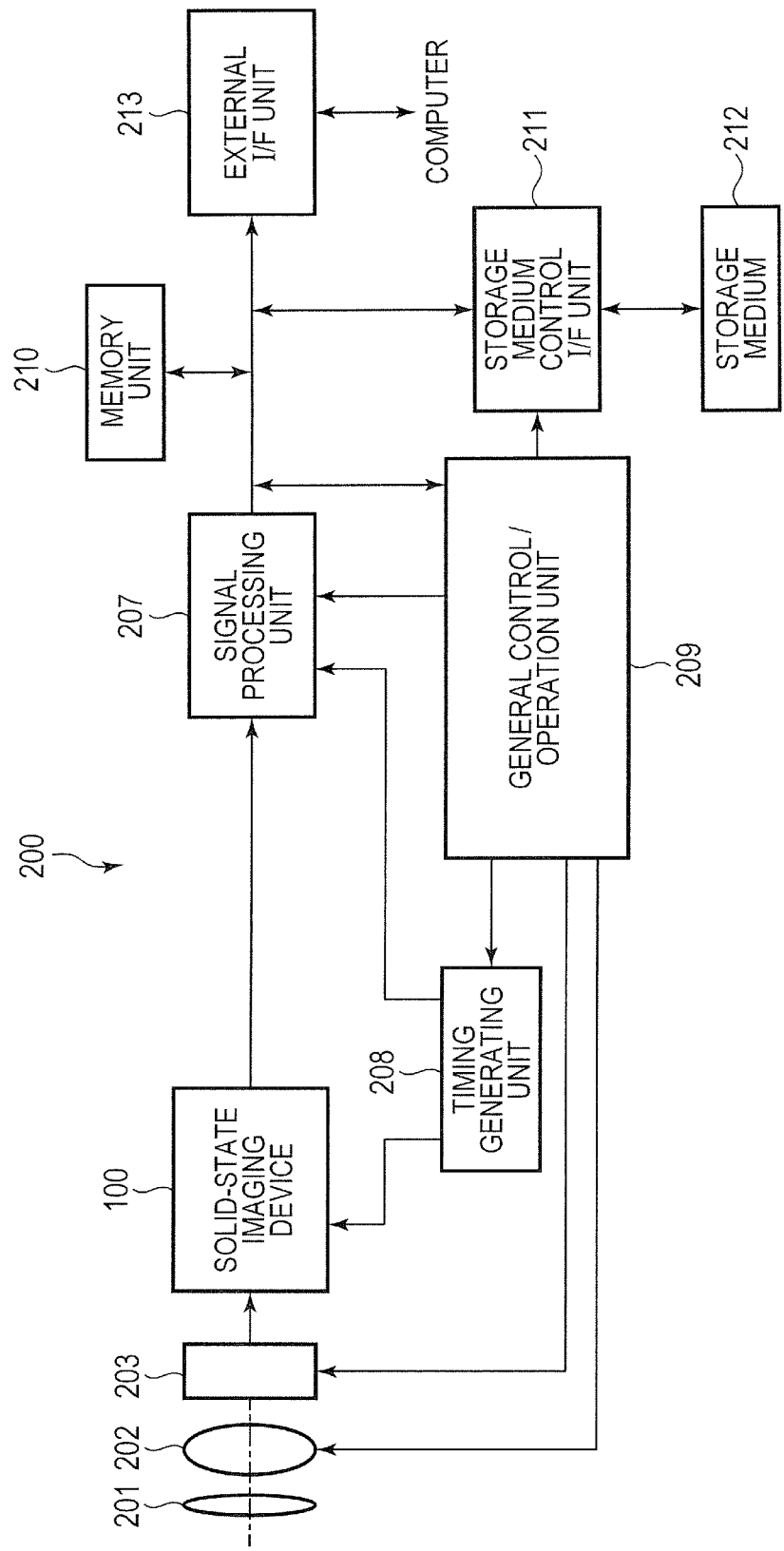
FIG. 11 is a schematic diagram illustrating a construction of an imaging system according to a fifth embodiment of the present invention.

FIG. 11 is a schematic diagram illustrating an example of a construction of the imaging system according to the present embodiment. Component elements similar to those in the solid-state imaging device according to each of the first to fourth embodiments illustrated in FIGS. 1 to 10B are designated by the same reference numerals and their description is omitted or simplified.

Although an imaging system 200 according to the present embodiment is not particularly limited, it can be applied to, for example, a digital still camera, a digital camcorder, a camera head, a copying apparatus, a facsimile, a cellular phone, an on-board camera, an observing satellite, and the like.

The imaging system 200 has the solid-state imaging device 100, a lens 202, an aperture 203, a barrier 201, a signal processing unit 207, a timing generating unit 208, a general control/operation unit 209, a memory unit 210, a storage medium control I/F unit 211, and an external I/F unit 213.

The lens 202 is provided to focus an optical image of an object to be photographed onto the imaging device 100. The aperture 203 is provided to vary an amount of light which passed through the lens 202. The barrier 201 is provided to protect the lens 202. The solid-state imaging device 100 is the solid-state imaging device described in the foregoing embodiments and converts the optical image focused by the lens 202 into image data.

The signal processing unit 207 is a signal processing unit for executing processes to perform various kinds of correction to the image pickup data output from the solid-state imaging device 100 and compress the data. An A/D converting unit for A/D converting the image data may be mounted onto the same substrate as that of the solid-state imaging device 100 or onto another substrate. Similarly, the signal processing unit 207 may be also mounted onto the same substrate as that of the solid-state imaging device 100 or onto another substrate. The timing generating unit 208 is provided to output various kinds of timing signals to the solid-state imaging device 100 and the signal processing unit 207. The general control/operation unit 209 is a general control unit to control the whole imaging system. The timing signals and the like may be input from the outside of the imaging system 200. It is sufficient that the imaging system has at least the solid-state imaging device 100 and the signal processing unit 207 for processing the imaging signal output from the solid-state imaging device 100.

The memory unit 210 is a frame memory unit to temporarily store the image data. The storage medium control I/F unit 211 is an interface unit to record the image data into a storage medium 212 or read out the image data from the storage medium 212. The storage medium 212 may be a detachable storage medium such as a semiconductor memory or the like for recording or reading out the image pickup data. The external I/F unit 213 is an interface unit to communicate with an external computer or the like.

By constructing the imaging system to which the solid-state imaging device according to each of the first to fourth embodiments is applied as mentioned above, the imaging system which can obtain an image of good quality in which the deterioration due to the saturation of the photodiode is suppressed can be realized.

[Modifications]

The present invention is not limited to the foregoing embodiments but various modifications are possible.

For example, although the solid-state imaging device using the electrons as signal charges has been described in the foregoing embodiments, the present invention can be also similarly applied to a solid-state imaging device using holes as signal charges.

Each of the circuit constructions of the pixels 12 illustrated in FIGS. 2, 6, and 9 is illustrated as an example of a pixel circuit which can be applied to each of the foregoing embodiments and the circuit constructions of the pixels 12 which can be applied to the solid-state imaging devices of the invention are not limited to them.

Although the solid-state imaging device in which each pixel has two photoelectric converting units has been described as an example in the foregoing third and fourth embodiments, the invention can be also similarly applied to a case of a solid-state imaging device in which each pixel has N photoelectric converting units. In this case, the signal charges generated by one photoelectric converting unit are separately accumulated in the N photoelectric converting units and the signal charges separately accumulated in the N photoelectric converting units are transferred to one floating diffusion portion and are read out as one signal. In the next frame, the signal charges from the photoelectric converting units of N pixels are respectively accumulated into N charge accumulating portions in which the read-out of one signal has been completed. Such an accumulation is started from a point of time when the read-out of the signal of one frame from 1/N pixels among a plurality of pixels has been completed.

In the foregoing embodiments, the solid-state imaging device having the charge accumulating portions for temporarily accumulating the signal charges generated in the photodiodes has been described with respect to the case of executing the operation of the full-pixel simultaneous electronic shutter. However, it is not always necessary to execute the operation of the full-pixel simultaneous electronic shutter. The present invention can be applied to the case of executing the operation in which the read-out period of the signals accumulated in the charge accumulating portion and the read-out period of the signal charges to the photodiode for the next frame overlap.

The imaging system illustrated in the fifth embodiment is an example of the imaging system to which the solid-state imaging device of the invention can be applied. The imaging system to which the solid-state imaging device of the invention can be applied is not limited to the construction illustrated in FIG. 11.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-249713, filed on Dec. 10, 2014, which is hereby incorporated by reference herein in its entirety.

What is claimed is:

1. A solid-state imaging device comprising:
   a plurality of pixels each including:
      a photoelectric conversion unit configured to photoelectrically convert incident light into signal charges;
      a charge accumulating portion configured to accumulate signal charges transferred from the photoelectric conversion unit;

a floating diffusion portion configured to accumulate signal charges transferred from the charge accumulating portion; and a read-out unit including a transfer transistor configured to transfer signal charges from the charge accumulating portion to the floating diffusion portion, and an amplifier transistor configured to read out a signal corresponding to the signal charges transferred to the floating diffusion portion; and a control unit configured to control the read-out unit so as to perform, after starting a read-out of signals of one frame from the charge accumulating portions of the plurality of pixels, an accumulation of signal charges for a next frame at the photoelectric conversion units of the plurality of pixels simultaneously, and to start, before completing the read-out of the signal of the one frame, an accumulation of signal charges at the charge accumulating portion of a pixel among the plurality of pixels from which the signal of the one frame is already read out, wherein:

the plurality of pixels are provided in a pixel area including a first area and a second area; and the control unit controls the read-out unit so as to perform, after a read-out of the signals from the pixels in the first area is completed, a read-out of the signals from the pixels in the second area, and to start, after the read-out of the signals from the pixels in the first area is completed and before the read-out of the signals from the pixels in the second area is completed, an accumulation of the signal charges at the charge accumulating portion of the pixels in the first area.

2. The solid-state imaging device according to claim 1, wherein the second area includes a part or all of a vertical optical black area.

3. The solid-state imaging device according to claim 1, wherein each of the plurality of pixels includes N charge accumulating portions; and the control unit controls the read-out unit so as to:

accumulate the signal charges generated in the photoelectric conversion unit separately into the N charge accumulating portions, transfer the signal charges separately accumulated into the N charge accumulating portions to one floating diffusion portion to read out as one signal, and accumulate, in the next frame, signal charges from the photoelectric conversion units of the N pixels into each of the N charge accumulating portions in which the one signal is already read out.

4. The solid-state imaging device according to claim 3, wherein the control unit controls the read-out unit so as to start the accumulation of the signal charges into the charge accumulating portions in which the one signal is already read out from a time when the read-out of the signal of the one frame from 1/N pixels among the plurality of pixels is finished.

5. The solid-state imaging device according to claim 3, wherein at least one charge accumulating portion among the N charge accumulating portions included in the one pixel is constituted so as to perfectly transfer accumulated charges into at least another one of the charge accumulating portions.

6. The solid-state imaging device according to claim 1, wherein the first area includes pixels to obtain an image signal.

7. The solid-state imaging device according to claim 1, wherein each of the first area and the second area includes at least one row of the pixels.

8. The solid-state imaging device according to claim 1, wherein the photoelectric conversion unit of at least one pixel is directly connected to two transfer transistors.

9. The solid-state imaging device according to claim 8, wherein two charge accumulating portions are connected to each of the two transfer transistors.

10. A solid-state imaging device comprising:

a plurality of pixels each including a photoelectric conversion unit configured to photoelectrically convert incident light and generate signal charges, and a charge accumulating portion configured to accumulate signal charges transferred from the photoelectric conversion unit; and a control unit configured to perform, before completing a read-out of signals from the plurality of pixels, an accumulation of signal charges into the charge accumulating portion of the pixel among the plurality of pixels which the signal is already read out, wherein:

the plurality of pixels are provided in a pixel area including a first area and a second area; and the control unit controls so as to perform, after a read-out of the signals from the pixels in the first area is completed, a read-out of the signals from the pixels in the second area, and to start, after the read-out of the signals from the pixels in the first area is completed and before the read-out of the signals from the pixels in the second area is completed, an accumulation of the signal charges at the charge accumulating portion of the pixels in the first area.

11. The solid-state imaging device according to claim 10, wherein the second area includes a part or all of a vertical optical black area.

12. The solid-state imaging device according to claim 10, wherein each of the plurality of pixels includes N charge accumulating portions; and the control unit controls the read-out unit so as to:

accumulate the signal charges generated in the photoelectric conversion unit separately into the N charge accumulating portions, transfer the signal charges separately accumulated into the N charge accumulating portions to one floating diffusion portion to read out as one signal, and accumulate, in the next frame, signal charges from the photoelectric conversion units of the N pixels into each of the N charge accumulating portions in which the one signal is already read out.

13. The solid-state imaging device according to claim 12, wherein the control unit controls the read-out unit so as to start the accumulation of the signal charges into the charge accumulating portions in which the one signal is already read out from a time when the read-out of the signal of the one frame from 1/N pixels among the plurality of pixels is finished.

14. The solid-state imaging device according to claim 12, wherein at least one charge accumulating portion among the N charge accumulating portions included in the one pixel is constituted so as to perfectly transfer accumulated charges into at least another one of the charge accumulating portions.

15. The solid-state imaging device according to claim 10, wherein the first area includes pixels to obtain an image signal.

16. The solid-state imaging device according to claim 10, wherein each of the first area and the second area includes at least one row of the pixels.

17. The solid-state imaging device according to claim 10, wherein the photoelectric conversion unit of at least one pixel is directly connected to two transfer transistors.

18. The solid-state imaging device according to claim 17, wherein two charge accumulating portions are connected to each of the two transfer transistors.

19. An imaging system comprising:

a solid-state imaging device including a plurality of pixels each including a photoelectric conversion unit configured to photoelectrically convert incident light and generate signal charges, a charge accumulating portion configured to accumulate signal charges transferred from the photoelectric conversion unit, a floating diffusion portion configured to accumulate signal charges transferred from the charge accumulating portion, and a read-out unit including a transfer transistor configured to transfer signal charges from the charge accumulating portion to the floating diffusion portion and an amplifier transistor configured to read out a signal corresponding to the signal charges transferred to the floating diffusion portion, and a control unit configured to control the read-out unit so as to perform, after starting a read-out of signals of one frame from the charge accumulating portions of the plurality of pixels, an accumulation of signal charges for a next frame at the photoelectric conversion units of the plurality of pixels simultaneously, and to start, before completing the read-out of the signal of the one frame, an accumulation of signal charges at the charge accumulating portion of a pixel among the plurality of pixels from which the signal of the one frame is already read out, wherein the plurality of pixels are provided in a pixel area including a first area and a second area, and wherein the control unit controls the read-out unit so as to perform, after a read-out of the signals from the pixels in the first area is completed, a read-out of the signals from the pixels in the second area, and to start, after the read-out of the signals from the pixels in the first area is completed and before the read-out of the signals from the pixels in the second area is completed, an accumulation of the signal charges at the charge accumulating portion of the pixels in the first area; and a signal processing device configured to process the signal output from the solid-state imaging device.

* * * * *